(12) United States Patent
Endo et al.

(10) Patent No.: US 7,939,240 B2
(45) Date of Patent: May 10, 2011

(54) LITHOGRAPHIC PRINTING PLATE PRECURSOR AND METHOD OF PRODUCING PRINTING PLATE

(75) Inventors: Akihiro Endo, Shizuoka (JP); Sumiaki Yamasaki, Shizuoka (JP); Seiji Uno, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 323 days.

(21) Appl. No.: 11/294,386

(22) Filed: Dec. 6, 2005

(65) Prior Publication Data

US 2006/0127810 A1 Jun. 15, 2006

(30) Foreign Application Priority Data

Dec. 10, 2004 (JP) ................................ P2004-358727
Jul. 22, 2005 (JP) ................................ P2005-212925

(51) Int. Cl.
*G03C 1/00* (2006.01)
*G03F 7/00* (2006.01)

(52) U.S. Cl. ............... 430/270.1; 430/281.1; 430/286.1; 430/300; 430/302; 430/138

(58) Field of Classification Search ............... 430/270.1, 430/272.1, 281.1, 286.1, 300, 302, 271.1
See application file for complete search history.

(56) References Cited

U.S. PATENT DOCUMENTS

| | | | | |
|---|---|---|---|---|
| 4,557,994 A | * | 12/1985 | Nagano et al. ................. | 430/162 |
| 6,014,929 A | | 1/2000 | Teng | |
| 6,672,210 B2 | * | 1/2004 | Kawamura et al. ........... | 101/457 |
| 6,680,161 B2 | * | 1/2004 | Oohashi ..................... | 430/273.1 |
| 6,703,185 B2 | * | 3/2004 | Hoshi ........................... | 430/302 |
| 6,794,104 B2 | * | 9/2004 | Tashiro ......................... | 430/138 |
| 6,890,700 B2 | * | 5/2005 | Tomita et al. ............... | 430/271.1 |
| 7,097,956 B2 | * | 8/2006 | Miyamoto et al. .......... | 430/270.1 |
| 2002/0007751 A1 | * | 1/2002 | Inoue et al. .................. | 101/453 |
| 2003/0129520 A1 | * | 7/2003 | Oohashi et al. ............... | 430/138 |
| 2003/0145748 A1 | | 8/2003 | Endo et al. | |
| 2006/0019196 A1 | * | 1/2006 | Miyoshi ..................... | 430/270.1 |
| 2006/0057492 A1 | * | 3/2006 | Kunita et al. ............... | 430/270.1 |

FOREIGN PATENT DOCUMENTS

| | | |
|---|---|---|
| JP | EP0581135 A1 * | 2/1994 |
| JP | 10-260536 | 9/1998 |
| JP | 2000-105462 A | 4/2000 |
| JP | 2002-287334 A | 10/2002 |
| JP | 2003-1956 A | 1/2003 |
| JP | 2004-9482 A | 1/2004 |

OTHER PUBLICATIONS

Office Action issued on Sep. 7, 2010 in connection with Japanese Application No. 2005-212925.

* cited by examiner

*Primary Examiner* — Cynthia H Kelly
*Assistant Examiner* — Connie P Johnson
(74) *Attorney, Agent, or Firm* — Birch, Stewart, Kolasch & Birch, LLP

(57) ABSTRACT

A lithographic printing plate precursor is provided and has a porous aluminum support, (1) a layer containing a water-soluble polymer resin having a hydrophilic substituent adsorbable to a surface of the porous aluminum support and a sulfonic acid, and (2) an image recording layer from which unexposed areas can be removed by supplying an oil-based ink and an aqueous component thereonto on a printing machine without being subjected to development after exposure. The layer containing the water-soluble polymer resin, which has come in contact with the oil-based ink and the aqueous component, has a sulfonic acid group left therein.

13 Claims, No Drawings

LITHOGRAPHIC PRINTING PLATE PRECURSOR AND METHOD OF PRODUCING PRINTING PLATE

FIELD OF THE INVENTION

The present invention relates to a lithographic printing plate precursor which can record an image thereon with an infrared laser beam and can then be developed on the printing machine, and a method of producing same.

BACKGROUND OF THE INVENTION

In general, a lithographic printing plate precursor comprises a lipophilic image area which receives an oil-based ink at the printing step and a hydrophilic non-image area which receives dampening water at the printing step. Lithographic printing is a printing method utilizing the repulsion between water and oil-based ink. In some detail, the lipophilic image area on the lithographic printing plate acts as an ink-receptive area while the hydrophilic non-image area acts as a dampening water-receptive area (ink-nonreceptive area). The surface of the lithographic printing plate is made different in ink affinity from area to area. An ink is then attached to the image area alone. The ink is then transferred to printing material such as paper to effect printing.

In order to prepare lithographic printing plates, a lithographic printing plate precursor (PS plate) comprising a lipophilic photosensitive resin layer (image recording layer) provided on a hydrophilic support has heretofore been widely used. In general, the lithographic printing plate precursor is exposed to light through an original such as lithographic film. The image area on the image recording layer is left undissolved while the other unnecessary image recording layer is dissolved away with an alkaline developer or organic solvent with. In this manner, the surface of the hydrophilic support is exposed to form a non-image area and obtain a lithographic printing plate.

The related art process for the production of light-transmitting requires a step of dissolving the unnecessary area away with a developer or the like after exposure. One of the recent technical assignments in the art is to eliminate or simplify a wet process which is additionally conducted as in the development step. In recent years, the disposal of waste liquid discharged from the wet process has become a great concern to the entire industry taking into account the global environment. With such an environmental problem, the demand for elimination of wet process has been growing more and more.

As a simple plate-making method there has been proposed a method called on-the-machine development method using an image recording layer which can be freed of unnecessary areas at an ordinary printing step. In some detail, after exposure, unnecessary areas are removed from the image recording layer on the printing machine to obtain a lithographic printing plate.

Specific examples of the on-the-machine development method include a method involving the use of a lithographic printing plate precursor comprising an image recording layer capable of being dissolved or dispersed in a dampening water, ink solvent or an emulsion of dampening water and ink, a method involving the dynamic removal of an image recording layer by contact with the rollers or blanket cylinder of the printing machine, and a method involving the dynamic removal of an image recording layer by contact with the rollers or blanket cylinder of the printing machine after the reduction of the cohesive force of the image recording layer or the adhesion between the image recording layer and the support by the penetration of dampening water, ink solvent, etc.

However, the related art method involving the use of an image recording layer of image recording process utilizing ultraviolet rays or visible light requires a troublesome procedure such as storage of exposed lithographic printing plate precursor under completely light-screened or constant temperature conditions until mounting on the printing machine because the image recording layer is not fixed even after exposure.

In recent years, on the other hand, a digitization technique involving electronic processing, storage and output of image data using computer has been widely spread. Various new image output methods that cope with this digitization technique have been put to practical use. With this technical trend, a computer-to-plate technique has been noted which comprises scanning a lithographic printing plate precursor with a highly convergent radiation such as laser beam having digitized image data carried thereon to produce a lithographic printing plate directly without lithographic film. Accordingly, one of important technical assignments is to obtain a lithographic printing plate precursor adapted for such a technique.

As mentioned above, it has recently been desired more keenly than ever to simplify the plate-making job, effect the plate-making job in a dry process and eliminate the disposal step from the plate-making job taking into account both global environment and adaptation to digitization.

Since high output lasers such as semiconductor laser emitting infrared rays having a wavelength of from 760 nm to 1,200 nm and YAG laser have been recently available at reduced cost, a method involving the use of these high output lasers as an image recording means has been considered a promising method of producing a lithographic printing plate by scanning exposure, which can be easily incorporated in digitization technique.

The related art plate-making method comprises imagewise exposing a photosensitive lithographic printing plate precursor to light at a low to middle intensity so that the resulting photochemical reaction in the image recording layer causes imagewise change of physical properties by which image recording is conducted. On the contrary, the aforementioned method involving the use of high output laser comprises irradiating the exposure area with a large amount of optical energy in an extremely short period of time so that the optical energy is efficiently converted to heat energy by which a thermal change such as chemical change, phase change and morphological or structural change occurs in the image recording layer, and then using this change to record image. Accordingly, image data is inputted in the form of optical energy such as laser beam, but image recording is effected taking into account reaction by heat energy in addition to optical energy. In general, such a recording method utilizing heat generation by high power density exposure is called "heat mode recording" and the conversion of optical energy to heat energy is called "photothermal conversion".

A great advantage of the plate-making method involving the use of heat mode recording is that the image recording layer cannot be exposed to light having an ordinary level of intensity such as indoor illumination and the fixation of image recorded by high intensity exposure is not essential. In other words, the lithographic printing plate precursor for use in heat mode recording cannot be exposed to indoor illumination before required exposure and it is not essential that images formed by exposure be fixed. Accordingly, the execution of a plate-making step of imagewise exposing an image recording layer capable of being insolubilized or solubilized by exposure to light from a high output laser on the printing machine to prepare a lithographic printing plate allows a printing system that gives an image insusceptible even to exposure to indoor ambient light. It can be therefore expected that the utilization of heat mode recording makes it possible to obtain a lithographic printing plate precursor suitable for on-the-machine development.

However, most of photosensitive recording materials which can be practically used as image recording layers are sensitive to visible light in the light wavelength range of 760 nm or less and thus cannot record image when irradiated with infrared laser beam. It has thus been desired to provide a material capable of recording image when irradiated with infrared laser beam.

To this end, Japanese Patent No. 2,938,397, for example, proposes a lithographic printing plate precursor comprising an image-forming layer having a particulate hydrophobic thermoplastic polymer dispersed in a hydrophilic binder provided on a hydrophilic support. Japanese Patent No. 2,938,397 discloses that when exposed to infrared laser beam, this lithographic printing plate precursor generates heat that causes the hydrophobic thermoplastic polymer particles to undergo coalescence resulting in the formation of an image. The lithographic printing plate is then mounted on the cylinder of the printing machine on which it can be developed with a dampening water and/or ink.

The aforementioned image forming method involving the coalescence of particles by mere heat fusion gives a good on-the-machine developability but is disadvantageous in that the resulting image recording layer exhibits an extremely poor image strength (adhesion to support) and hence an insufficient press life.

Further, JP-A-2001-277740 and JP-A-2001-277742 disclose a lithographic printing plate precursor comprising microcapsules having a polymerizable compound encapsulated therein incorporated in a hydrophilic support.

Moreover, JP-A-2002-287334 discloses a lithographic printing plate precursor comprising a photosensitive layer (image recording layer) containing an infrared absorbent, a radical polymerization initiator and a polymerizable compound provided on a support.

Thus, the method involving the use of polymerization reaction provides an image area having a higher chemical bond density and hence a relatively higher image strength than that formed by heat fusion of polymer particles but leaves something to be desired all in on-the-machine developability, press and polymerization efficiency (sensitivity) and stainproofness from the practical standpoint of view and thus has not yet been practically used.

In the related art of lithographic printing plate precursor comprising a photosensitive polymerizable composition layer, a technique which comprises providing a undercoating layer containing a polymerizable compound in the interface of the photosensitive polymerizable composition layer with the support to exert an effect of enhancing press life is known in, e.g., Japanese Patent No. 3,475,377 and JP-A-10-260536. However, these techniques require that the undercoating layer be removed by alkaline development. Accordingly, in the case where development is effected with an oil-based ink and an aqueous component on the printing machine rather than with alkali, the undercoating layer remains on the non-image area, causing the occurrence of stain on the area which is not desired to have ink attached thereto. Thus, desired printed matters cannot be obtained.

JP-A-2004-9482 discloses a technique of spreading a silicate-based glass as a undercoating layer in a method of forming an image with an oil-based ink and an aqueous component on the printing machine. The provision of such a silicate-based glass makes it possible to enhance the hydrophilicity of the surface of the support and enhance the image-forming properties but causes drastic drop of the adhesion between the photosensitive layer and the support, giving a tendency for deterioration of press life.

Further, U.S. Pat. No. 6,014,929 discloses a lithographic printing plate comprising an interlayer provided on a mechanically-interlockable support which interlayer can be separatable when dissolved or dispersed in a dampening water or ink. In general, however, a hydrophilic resin which can be separated with a dampening water or aqueous component makes it possible to enhance image-forming properties as mentioned above but causes drastic drop of the adhesion between the photosensitive layer and the support, giving a tendency for deterioration of press life. Further, the resin exemplified in Patent Reference 8 exhibits a high affinity for a hydrophilic support and thus remains during printing, causing undesirable staining on the non-image area or making it difficult to maintain printing unless excessive dampening water is supplied. It was further made obvious that there occur practically serious defects such as unstable ink density and incapability of removing ink from the non-image area when the operation of the printing machine is once suspended to confirm the quality of printed matters and then resumed.

SUMMARY OF THE INVENTION

An object of an illustrative, non-limiting embodiment of the invention is to solve the aforementioned problems. Another object of an illustrative, non-limiting embodiment of the invention is to provide a lithographic printing plate precursor excellent in on-the-machine developability, stain-proofness, press life and age stability which allows image-wise recording with infrared laser and on-the-machine development after imagewise recording, and to provide a method of producing a lithographic printing plate using the lithographic printing plate precursor. Also, the invention is not required to solve the aforementioned problems, and an illustrative, non-limiting embodiment of the present invention may solve a different problem or may not solve any problems.

The inventors made extensive studies of lithographic printing plate precursors focusing on the constituents of negative-working image recording material to be used in the image recording layer of lithographic printing plate precursor. As a result, it was found that the aforementioned object is accomplished by providing on a porous aluminum support a layer of a specific water-soluble polymer resin having a hydrophilic substituent adsorbable to the surface of the porous aluminum support and a sulfonic acid which remains even after contact with an oil-based ink and an aqueous component during printing and providing an image recording layer thereon. The invention has thus been worked out.

In other words, the invention has the following constitutions.

1. A lithographic printing plate precursor comprising: a porous aluminum support; (1) a layer containing a water-soluble polymer resin having a hydrophilic group and a sulfonic acid group, the hydrophilic group being adsorbable to the surface of the support; and (2) an image recording layer, wherein after the image recording layer is exposed to light, an unexposed area can be removed from the image recording layer on a printing machine by supplying an oil-based ink and an aqueous component to the image recording layer without being subjected to development, wherein the layer containing the water-soluble polymer resin has the sulfonic acid group left therein after coming in contact with the oil-based ink and the aqueous component.

2. The lithographic printing plate precursor as defined in Clause 1, wherein the water-soluble polymer resin has at least one substituent selected from the group consisting of onium salt group, phosphoric acid ester group, phosphonic acid group, boric acid group, β-diketone group, carboxylic acid group, carboester group, hydroxyl group and carbamoyl group as the hydrophilic group adsorbable to the surface of the support.

3. The lithographic printing plate precursor as defined in Clause 1 or 2, wherein the image recording layer comprises a microcapsule or microgel incorporated therein.

4. A method of producing a lithographic printing plate, which comprises: exposing to light a lithographic printing plate precursor defined in any one of Clauses 1 to 3; and supplying an oil-based ink and an aqueous component to the lithographic printing plate precursor on the printing machine without being subjected to development so as to remove an unexposed area from the image recording layer.

In the invention, the combination of a porous aluminum support surface and a layer (undercoating layer) containing a specific water-soluble polymer resin makes it possible to attain a lithographic printing plate precursor excellent in on-the-machine developability, stainproofness, press life and age stability.

This mechanism of action is not made obvious yet. However, the following mechanism can be presumed. In some detail, the presence of the aforementioned undercoating layer makes it possible to prevent the image recording layer from being directly adsorbed to the surface of the support. Accordingly, in the case where an oil-based ink and an aqueous component are supplied onto the lithographic printing plate precursor on the printing machine to remove the unexposed area from the image recording layer, the unexposed area can be removed leaving the image recording layer little behind. Further, the action of the highly adsorbable aluminum support surface with the water-soluble polymer resin having an adsorbable hydrophilic substituent and a sulfonic acid group causes the water-soluble polymer resin to remain on the support even during printing, keeping the lithographic printing plate hydrophilic. Thus, a good stainproofness can be obtained.

In accordance with the invention, a lithographic printing plate precursor excellent in on-the-machine developability, stainproofness, press life and age stability which allows imagewise recording with infrared laser and on-the-machine development after imagewise recording and a method of producing a lithographic printing plate using the lithographic printing plate precursor can be provided.

DETAILED DESCRIPTION OF THE INVENTION

The term "development (or development step)" as used herein is meant to indicate a step of allowing the lithographic printing plate precursor to come in contact with a liquid (normally an alkaline developer) in an apparatus other than printing machine (normally an automatic developing machine) to remove the area unexposed to infrared laser beam from the lithographic printing plate precursor so that the surface of the hydrophilic support is exposed unless otherwise specified. The term "on-the-machine development" as used herein is meant to indicate a method and step of allowing the lithographic printing plate precursor to come in contact with a liquid (normally a printing ink and/or dampening water) in a printing machine to remove the area unexposed to infrared laser beam from the lithographic printing plate precursor so that the surface of the hydrophilic support is exposed unless otherwise specified.

The invention will be further described hereinafter.
(Lithographic Printing Plate Precursor)<
Layer Containing Water-Soluble Polymer Resin>

The required components of the water-soluble polymer resin to be used in the layer containing a water-soluble polymer resin of the invention (hereinafter also referred to as "undercoating layer") are hydrophilic group adsorbable to the surface of a hydrophilic support (hereinafter occasionally abbreviated as "adsorbable group") and a sulfonic acid group. The presence of the adsorbability to the surface of the hydrophilic support can be judged, e.g., by the following method.

A coating solution comprising the compound to be tested in a good solvent is prepared. The coating solution is spread over the support in an amount such that the dried spread is 30 mg/m$^2$, and then dried. The support thus coated with the compound to be tested is thoroughly washed with the good solvent. The residue of the compound left unremoved is then measured to determine the amount of the compound adsorbed to the support. For the measurement of the residue of the compound, the amount of the residual compound may be directly measured. Alternatively, the amount of the compound dissolved in the cleaning solvent may be determined. For the quantitative determination of the compound, fluorescent X-ray measurement, reflective spectral absorption measurement, liquid chromatography, etc. may be used. The compound adsorbable to the support is a compound which remains in an amount of 1 mg/m$^2$ or more even when subjected to washing as mentioned above.

The group adsorbable to the surface of the hydrophilic support is a functional group that can cause chemical bonding (e.g., ionic bonding, hydrogen bonding, coordinate bonding, bonding by intermolecular force) to materials (e.g., metal, metal oxide) or functional groups (e.g., hydroxyl group) present on the surface of the hydrophilic support.

Examples of the hydrophilic group adsorbable to the surface of the support (adsorbable group) include onium groups, phosphoric acid ester groups, phosphonic acid groups, boric acid groups, β-diketone groups, carboxyl acid groups, carboester groups, hydroxyl groups, and carbamoyl groups. Preferred examples of these adsorbable groups include acid groups and cationic groups.

The acid group preferably has an acid dissociation constant (pKa) of 7 or less. Examples of the acid group include phenolic hydroxyl groups, carboxyl groups, —PO$_3$H$_2$, —OPO$_3$H$_2$, —CONHSO$_2$—, —SO$_2$NHSO$_2$—, and —COCH$_2$COCH$_3$. Particularly preferred among these acid groups are —OPO$_3$H$_2$ and —PO$_3$H$_2$. These acid groups may be in the form of metal salt.

The cationic group is preferably an onium group. Examples of the onium group include ammonium groups, phosphonium groups, arsonium groups, stibonium groups, oxonium groups, sulfonium groups, selenonium groups, stannonium groups, and iodonium groups. Preferred among these onium groups are ammonium groups, phosphonium groups and sulfonium groups. More desirable among these onium groups are ammonium groups and phosphonium groups. Most desirable among these onium groups are ammonium groups.

Particularly preferred examples of the monomer having an adsorbable group include compounds represented by the following formula (I) or (II):

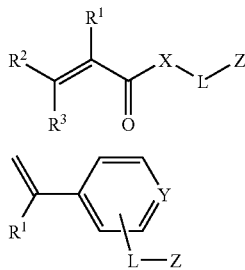

In formula (I), $R^1$, $R^2$ and $R^3$ each independently represent a hydrogen atom, halogen atom or $C_1$-$C_6$ alkyl group. $R^1$, $R^2$ and $R^3$ each independently are preferably a hydrogen atom or $C_1$-$C_6$ alkyl group, more preferably a hydrogen atom or $C_1$-$C_3$ alkyl group, most preferably a hydrogen atom or methyl group. In particular, $R^2$ and $R^3$ each are preferably a hydrogen atom.

In formula (I), X represents an oxygen atom (—O—) or imino (—NH—). X is preferably an oxygen atom. In formula (I), L is a divalent connecting group. L is preferably a divalent aliphatic group (e.g., alkylene group, substituted alkylene group, alkenylene group, substituted alkenylene group, alkinylene group, substituted alkinylene group), a divalent aromatic group (e.g., arylene group, substituted arylene group), a divalent heterocyclic group or a combination thereof with an oxygen atom (—O—), sulfur atom (—S—), imino (—NH—), substituted imino (—NR— in which R represents an aliphatic group, aromatic group or heterocyclic group) or carbonyl group (—CO—).

The aliphatic group may have a cyclic structure or branched structure. The number of carbon atoms in the aliphatic group is preferably from 1 to 20, more preferably from 1 to 15, most preferably from 1 to 10. Referring to the aliphatic group, saturated aliphatic group is preferable to unsaturated aliphatic group. The aliphatic group may have substituents. Examples of these substituents include halogen atoms, hydroxyl groups, aromatic groups, and heterocyclic groups.

The number of carbon atoms in the aromatic group is preferably from 6 to 20, more preferably from 6 to 15, most preferably from 6 to 10. The aromatic group may have substituents. Examples of these substituents include halogen atoms, hydroxyl groups, aliphatic groups, aromatic groups, and heterocyclic groups.

The heterocyclic group preferably has a 5- or 6-membered ring as heterocycle. To the heterocycle may be condensed other heterocycles, aliphatic rings or aromatic rings. The heterocyclic group may have substituents. Examples of these substituents include halogen atoms, hydroxyl groups, oxo groups (=O), thioxo groups (=S), imino groups (=NH), substituted imino groups (=N—R in which R represents an aliphatic group, aromatic group or heterocyclic group), aliphatic groups, aromatic groups, and heterocyclic groups.

L is preferably a divalent connecting group containing a plurality of polyoxyalkylene structures. The polyoxyalkylene structure is more preferably a polyoxyethylene structure. In other words, L preferably contains —(OCH$_2$CH$_2$)$_n$— (in which n is an integer of 2 or more).

In formula (I), Z represents a functional group adsorbable to the surface of the hydrophilic support.

In formula (II), $R^1$, L and Z are as defined in formula (I).

Y represents a carbon atom or nitrogen atom. When L is connected to Y which is a nitrogen atom to form a quaternary pyridinium group, the quaternary pyridinium group itself is adsorbable. Therefore, Z is not essential.

Representative examples of the monomer represented by formula (I) or (II) will be given below.

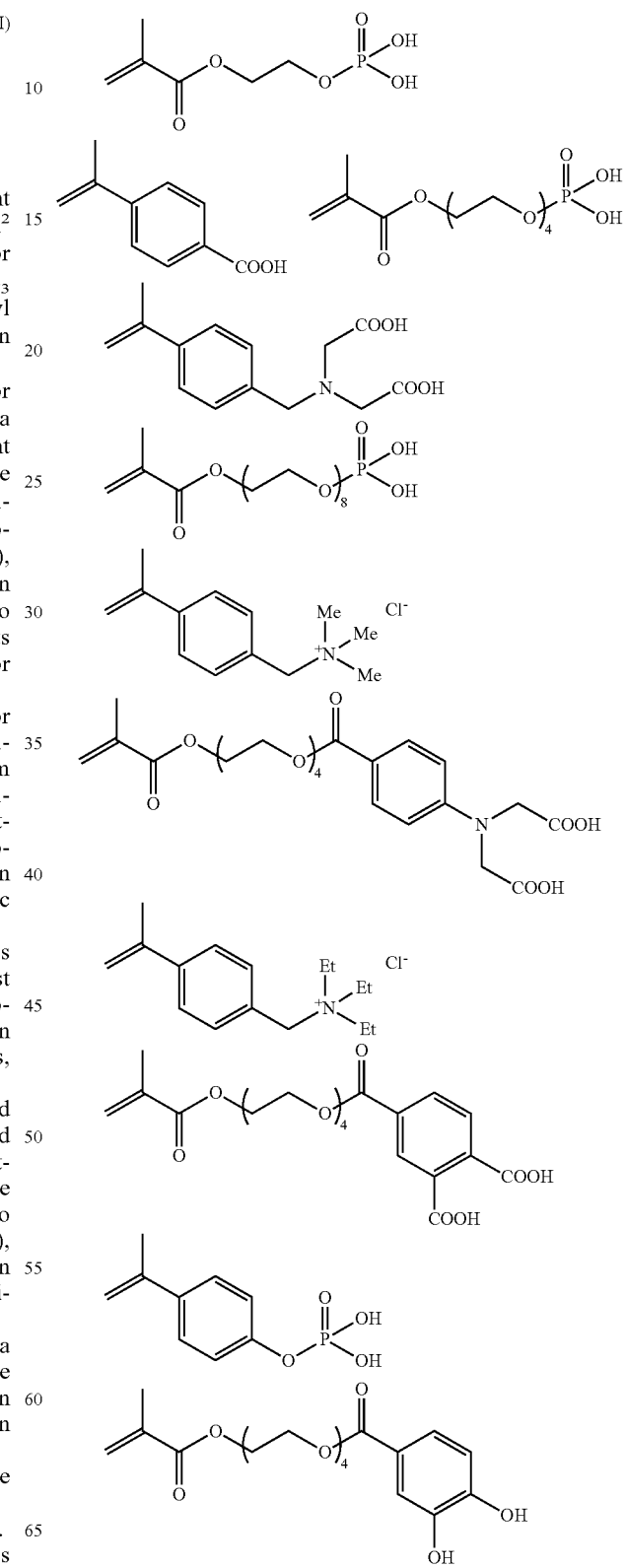

-continued

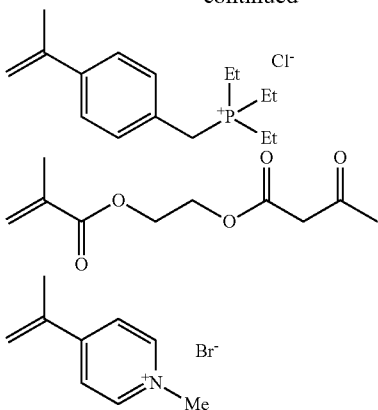

Specific examples of the monomer having a highly hydrophilic sulfonic acid group which is a second required component in the water-soluble polymer resin of the invention include methallyloxybenzenesulfonic acid, allylxybenzenesulfonic acid, allylsulfonic acid, vinylsulfonyl acid, allylsulfonic acid, p-styrenesulfonic acid, methallylsulfonic acid, acrylamide-t-butyl sulfonic acid, 2-acrylamide-2-methylpropanesulfonic acid, and sodium salt and amine salt of (3-acryloyloxypropyl)butylsulfonic acid. Particularly preferred among these monomers is sodium salt of 2-acrylamide-2-methylpropanesulfonic acid from the standpoint of hydrophilicity and synthesizability.

In the invention, a water-soluble copolymer obtained by the copolymerization of the aforementioned monomer having an adsorbable group with a monomer having a sulfonic acid group, too, may be used as a water-soluble polymer resin of the invention. Preferred examples of the copolymerizable monomer include hydrophilic groups such as hydroxyl group, carboxyl group, carboxylate group, hydroxyethyl group, polyoxyethyl group, hydroxypropyl group, polyoxypropyl group, amino group, aminoethyl group, aminopropyl group, ammonium group, amide group, carboxymethyl group, sulfonic acid group and phosphoric acid group.

The water-soluble polymer resin for the undercoating layer of the invention preferably has a crosslinkable group. The provision of the crosslinkable group makes it possible to enhance the adhesion to the image area. In order to render the polymer resin for the undercoating layer crosslinkable, a crosslinkable functional group such as ethylenically unsaturated bond may be incorporated in the side chains in the polymer. Alternatively, the polymer resin may form a salt structure with a compound having a substituent having a charge counter to that of polar substituent in the polymer resin and an ethylenically unsaturated bond so that a crosslinkable functional group can be incorporated therein.

Examples of the polymer having an ethylenically unsaturated bond in the side chains in the polymer include polymers of acrylic or methacrylic acid ester or amide wherein the ester or amide residue (R in —COOR or —CONHR) has an ethylenically unsaturated bond.

Examples of the residue (R as mentioned above) having an ethylenically unsaturated bond include —$(CH_2)_n$CR$_1$=CR$_2$R$_3$, —$(CH_2O)_n$CH$_2$CR$_1$=CR$_2$R$_3$, —$(CH_2CH_2O)_n$CH$_2$CR$_1$=CR$_2$R$_3$, —$(CH_2)_n$NH—CO—O—CH$_2$CR$_1$=CR$_2$R$_3$, —$(CH_2)_n$—O—CO—CR$_1$=CR$_2$R$_3$, and —$(CH_2CH_2O)_2$—X (in which R$_1$ to R$_3$ each represent a hydrogen atom, halogen atom or C$_1$-C$_{20}$ alkyl, aryl, alkoxy or aryloxy group; R$_1$ and R$_2$ or R$_3$ may be connected to each other to form a ring; n represents an integer of from 1 to 10; and X represents a dicyclopentadienyl residue).

Specific examples of the ester residue include —CH$_2$CH=CH$_2$ (as disclosed in JP-B-7-21633), —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$NHCOO—CH$_2$CH=CH$_2$, and —CH$_2$CH$_2$O—X (in which X represents a dicyclopentadienyl residue).

Examples of the amide residue include —CH$_2$CH=CH$_2$, —CH$_2$CH$_2$O—Y (in which Y represents a cyclohexene residue), and —CH$_2$CH$_2$OCO—CH=CH$_2$.

As the monomer having a crosslinkable group constituting the polymer resin for undercoating layer there is preferably used an ester or amide of the aforementioned acrylic or methacrylic acid having a crosslinkable group.

The content of the crosslinkable group in the polymer resin for undercoating layer (content of radical-polymerizable unsaturated double bonds determined by iodine titration) is preferably from 0.1 to 10.0 mmol, more preferably from 1.0 to 7.0 mmol, most preferably from 2.0 to 5.5 mmol per g of polymer resin. When the content of the crosslinkable group in the polymer resin for undercoating layer falls within the above defined range, both good sensitivity and good stainproofness can be attained and a good storage stability can be obtained.

The polymer resin for the undercoating layer preferably exhibits a weight-average molecular weight of 5,000 or more, more preferably from 10,000 to 300,000, and a number-average molecular weight of 1,000 or more, more preferably from 2,000 to 250,000. The degree of polydispersion (weight-average molecular weight/number-average molecular weight) of the polymer resin is preferably from 1.1 to 10.

The polymer resin for the undercoating layer may be any of a random polymer, block polymer, graft polymer, etc., but is preferably a random polymer.

In order to allow the water-soluble polymer resin (the sulfonic acid group) to remain during printing after development on the printing machine, the proportion of the unit having the adsorbable group is preferably from 2 to 80 mol-%, more preferably from 5 to 50 mol-%, most preferably from 10 to 40 mol-% based on the entire polymer resin, though depending on the kind of the adsorbable group. In order to develop hydrophilicity during printing, the proportion of the unit having the sulfonic acid group is preferably from 30 to 98 mol-%, more preferably from 40 to 90 mol-%, most preferably from 50 to 80 mol-% based on the entire polymer resin.

The undercoating layer of the invention may comprise the aforementioned water-soluble polymer resins incorporated therein singly or in admixture of two or more thereof. The undercoating layer of the invention may comprise a surface active agent described later incorporated therein as necessary.

The formation of the aforementioned undercoating layer can be carried out by a method which comprises spreading a solution of the aforementioned compound in water, an organic solvent such as methanol and ethanol or a mixture thereof over a surface-treated aluminum support, and then drying the coated support or a method which comprises dipping a surface-treated aluminum support in a solution of the aforementioned compound in water, an organic solvent such as methanol and ethanol or a mixture thereof for a period of time, cleaning the coated aluminum support with water or the like, and then drying the coated aluminum support. In the former method, a solution of the aforementioned compound having a concentration of from 0.005 to 10% by weight can be spread by various methods such as bar coater coating, rotary coating, spray coating and curtain coating. In the latter method, the concentration of the solution is from 0.01 to 20% by weight, preferably from 0.05 to 5% by weight, the dipping temperature is from 20° C. to 90° C., preferably from 25° C. to 50° C., and the dipping time is from 0.1 seconds to 20 minutes, preferably from 2 seconds to 1 minute.

The spread (solid content) of the undercoating layer is preferably from 0.1 to 100 mg/m$^2$, more preferably from 1 to 30 mg/m$^2$.

<Support>

The support to be incorporated in the lithographic printing plate precursor of the invention is a porous aluminum sheet. The aluminum sheet to be used in the invention is a pure aluminum sheet, an alloy sheet comprising aluminum as a main component and a slight amount of foreign elements or a thin aluminum or aluminum alloy sheet laminated with a plastic. Examples of the foreign elements to be incorporated in the aluminum alloy include silicon, iron, manganese, copper, magnesium, chromium, zinc, bismuth, nickel, and titanium. The content of foreign elements in the alloy is preferably 10% by weight or less. In the invention, a pure aluminum sheet is preferred. However, since completely pure aluminum can be difficultly produced from the standpoint of refining technique, the aluminum sheet may contain a slight amount of foreign elements. Thus, the aluminum to be used in the invention is not specifically limited in its composition. An aluminum sheet made of material which has heretofore been known can be properly used.

The thickness of the support to be used herein is from about 0.1 mm to 0.6 mm, preferably from about 0.15 mm to 0.4 mm.

Prior to use, the aluminum sheet is preferably subjected to surface treatment such as roughening and anodization. When subjected to surface treatment, the aluminum sheet can be easily provided with an enhanced hydrophilicity and a good adhesion to the image recording layer. Prior to roughening, the aluminum sheet is optionally subjected to degreasing with a surface active agent, an organic solvent, an alkaline aqueous solution or the like for the purpose of removing a rolling oil from the surface thereof.

The surface treatment of the surface of the aluminum sheet may be carried out by various methods. Examples of these surface treatment methods employable herein include mechanical roughening, electrochemical roughening (roughening involving electrochemical dissolution of surface), and chemical roughening (roughening involving chemical selective dissolution of surface).

As the mechanical roughening method there may be used any known method such as ball polishing, brush polishing, blast polishing and buff polishing. Alternatively, a transfer method may be used which comprises transferring a roughened shape from a roughened roll to the aluminum sheet during the step of rolling the aluminum sheet.

As the electrochemical roughening method there may be used, e.g., ac or dc electrochemical roughening in an electrolyte containing an acid such as hydrochloric acid and nitric acid. Alternatively, a method involving the use of a mixed acid as disclosed in JP-A-54-63902 may be employed.

The aluminum sheet thus roughened is subjected to alkaline etching with an aqueous solution of potassium hydroxide, sodium hydroxide or the like as necessary, neutralized, and then optionally subjected to anodization to enhance the abrasion resistance thereof.

As the electrolyte to be used in the anodization of the aluminum sheet there may be used any of various electrolytes capable of forming a porous oxide film. Sulfuric acid, hydrochloric acid, oxalic acid, chromic acid or mixture thereof is normally used. The concentration of these electrolytes may be properly determined by their kind.

The anodization conditions vary with the kind of the electrolyte used and thus cannot be unequivocally predetermined. In general, the electrolyte concentration, electrolyte temperature, current density, voltage and electrolysis time are preferably from 1 to 80% by weight, from 5° C. to 70° C., from 5 to 60 A/dm$^2$, from 1 to 100 V and from 10 seconds to 5 minutes, respectively. The amount of the anodized film thus formed is preferably from 1.0 to 5.0 g/m$^2$, more preferably from 1.5 to 4.0 g/m$^2$. When the amount of the anodized film falls within this range, the resulting aluminum sheet can be provided with a good scratch resistance, making it possible to provide the non-image area on the lithographic printing plate with a good scratch resistance.

As the support to be used in the invention there may be used the aforementioned surface-treated anodized support as it is. However, in order to further improve the adhesion with upper layer, hydrophilicity, stain resistance, heat insulation, etc., the support may be subjected to treatment properly selected from the group consisting of treatment for expansion of micropores in anodized film, treatment for sealing of micropores and surface hyrophilicization treatment involving dipping in an aqueous solution containing a hydrophilic compound as disclosed in JP-A-2001-253181 and JP-A-2001-322365 as necessary. It goes without saying that the treatment for expansion of micropores and the treatment for sealing of micropores to be effected in the invention are not limited to the above cited examples but may be any of known methods.

The treatment for sealing of micropores, if effected, can be carried out by single treatment with fluorozirconic acid, treatment with sodium fluoride or treatment with steam having lithium chloride incorporated therein besides treatment with steam.

The treatment for sealing of micropores to be effected in the invention is not specifically limited. Any method known as such may be employed. In particular, treatment for sealing of micropores involving the use of an aqueous solution containing an inorganic fluorine compound, water vapor or hot water is preferred. These treatment methods will be further described hereinafter.

As the inorganic fluorine compound to be used in the treatment for sealing of micropores involving the use of an aqueous solution containing an inorganic fluorine compound there is preferably used a metal fluoride.

Examples of the metal fluoride include sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, iron fluoride, fluorophosphoric acid, and ammonium fluorophosphate. Particularly preferred among these metal fluorides are sodium fluorozirconate, sodium fluorotitanate, fluorozirconic acid, and fluorotitanic acid.

The concentration of inorganic fluorine compounds in the aqueous solution is preferably 0.01% by weight or more, more preferably 0.05% by weight or more to sufficiently seal the micropores in the anodized layer. From the standpoint of stainproofness, the concentration of inorganic fluorine compounds in the aqueous solution is preferably 1% by weight or less, more preferably 0.5% by weight or less.

The aqueous solution containing an inorganic fluorine compound preferably further contains a phosphate compound. When the aqueous solution further contains a phosphate compound, the hydrophilicity of the surface of the anodized layer can be enhanced, making it possible to enhance the on-the-machine developability and stainproofness of the lithographic printing plate precursor.

Preferred examples of the phosphate compound include phosphates of alkaline metals, alkaline earth metals, etc.

Specific examples of these phosphates include zinc phosphate, aluminum phosphate, ammonium phosphate, diammonium hydrogenphosphate, ammonium dihydrogenphosphate, monoammonium phosphate, monopotassium phosphate, monosodium phosphate, potassium dihydrogenphosphate, dipotassium hydrogenphosphate, calcium phosphate, ammonium sodium hydrogenphosphate, magnesium hydrogenphosphate, magnesium phosphate, ferrous phosphate, ferric phosphate, sodium dihydrogenphosphate, sodium phosphate, disodium hydrogenphosphate, lead phosphate, diammonium phosphate, calcium dihydrogenphosphate, lithium phosphate, phosphotungustic acid, ammonium phosphotungstate, sodium phosphotungstate, ammonium phosphomolybdate, sodium phosphomolybdate, sodium phosphite, sodium tripolyphosphate, and sodium pyrophosphate. Particularly preferred among these phosphate compounds are sodium dihydrogenphosphate, disodium phosphate, potassium dihydrogenphosphate, and dipotassium phosphate.

The combination of inorganic fluorine compound and phosphate compound is not specifically limited. However, the aqueous solution preferably contains at least sodium fluorozirconate as an inorganic fluorine compound and at least sodium dihydrogenphosphate as a phosphate compound.

The concentration of phosphate compounds in the aqueous solution is preferably 0.01% by weight or more, more preferably 0.1% by weight or more from the standpoint of enhancement of on-the-machine developability and stainproofness and is preferably 20% by weight or less, more preferably 5% by weight or less from the standpoint of solubility.

The proportion of the various compounds in the aqueous solution is not specifically limited. However, the weight ratio of inorganic fluorine compound to phosphate compound is preferably from 1/200 to 10/1, more preferably from 1/30 to 2/1.

Further, the temperature of the aqueous solution is preferably 20° C. or more, more preferably 40° C. or more, and is preferably 100° C. or less, more preferably 80° C. or less.

Moreover, the pH value of the aqueous solution is preferably 1 or more, more preferably 2 or more, and is preferably 11 or less, more preferably 5 or less.

The method for treatment for sealing of micropores with an aqueous solution containing an inorganic fluorine compound is not specifically limited. For example, dipping method or spraying method may be employed. One of these methods may be effected once or a plurality of times. Alternatively, two or more of these methods may be effected in combination.

In particular, dipping method is preferably effected. In the case where dipping method is used, the treatment time is preferably 1 second or more, more preferably 3 seconds or more, and is preferably 100 seconds or less, more preferably 20 seconds or less.

Examples of the treatment for sealing of micropores with water vapor include a method which comprises continuously or discontinuously bringing compressed or normal pressure water vapor into contact with the anodized layer.

The temperature of the water vapor is preferably 80° C. or more, more preferably 95° C. or more, and is preferably 105° C. or less.

The pressure of the water vapor preferably falls within a range of from (atmospheric pressure−50 mmAq) to (atmospheric pressure+300 mmAq) ($1.008 \times 10^5$ to $1.043 \times 10^5$ Pa).

The time during which water vapor is brought into contact with the anodized layer is preferably 1 seconds or more, more preferably 3 seconds or more, and is preferably 100 seconds or less, more preferably 20 seconds or less.

Examples of the treatment for sealing of micropores with hot water include a method which comprises dipping an aluminum sheet having an anodized layer formed thereon in hot water.

The hot water may contain an inorganic salt (e.g., phosphate) or organic salt.

The temperature of the hot water is preferably 80° C. or more, more preferably 95° C. or more, and is preferably 100° C. or less.

Further, the time during which the aluminum sheet is dipped in hot water is preferably 1 second or more, more preferably 3 seconds or more, and is preferably 100 seconds or less, more preferably 20 seconds or less.

In the invention, prior to the aforementioned treatment for sealing of micropores, a treatment for the expansion of micropores in the anodized layer as disclosed in JP-A-2001-322365 may be effected. Alternatively, the treatment for sealing of micropores may be followed by surface hydrophilicization treatment.

As the hydrophilicization treatment there may be used an alkaline metal silicating method as disclosed in U.S. Pat. Nos. 2,714,066, 3,181,461, 3,280,734 and 3,902,734. In accordance with this method, the support is dipped in or electrolyzed with an aqueous solution of sodium silicate or the like. Other examples of the hydrophilicization treatment include a method which comprises treatment with potassium fluorozirconate as disclosed in JP-B-36-22063, and a method which comprises treatment with a polyvinylphosphonic acid as disclosed in U.S. Pat. Nos. 3,276,868, 4,153,461 and 4,689,272.

The support of the invention preferably has a central line-average roughness of from 0.10 μm to 1.2 μm. When the support has a central line-average roughness falling within this range, a good adhesion to the image recording layer, a good press life and a good stainproofness can be obtained.

<Image Recording Layer>.

The image recording layer of the invention is a layer which can be freed of unexposed areas by supplying an oil-based ink and an aqueous component thereonto on the printing machine without being subjected to development process after exposure. Such an image recording layer is preferably an image recording layer comprising (A) an infrared absorbent, (B) a polymerization initiator, (C) a polymerizable compound and (D) a binder polymer which allows recording when irradiated with infrared rays.

In the lithographic printing plate precursor having the aforementioned formulation, when irradiated with infrared rays, the image recording layer undergoes hardening on the exposed area to form a hydrophobic (lipophilic) area. During the beginning of printing, the unexposed area is rapidly removed from the support with an aqueous component such as dampening water, an oil-based component such as ink or an emulsion of aqueous component with oil-based component.

<(A) Infrared Absorbent>

In the case where the lithographic printing plate precursor of the invention is imagewise irradiated with laser beam from a laser which emits infrared rays having a wavelength of from 760 nm to 1,200 nm as a light source, it is normally required to use an infrared absorbent. An infrared absorbent acts to convert infrared rays absorbed to heat. The heat thus generated causes a polymerization initiator (radical generator)

described later to undergo thermal decomposition resulting in the generation of radicals. The infrared absorbent to be used in the invention is a dye or pigment having an absorption maxima in a wavelength range of from 760 nm to 1,200 nm.

As the dye there may be used any of commercially available dyes such as known dyes described in references such as "Senryo Binran (Handbook of Dyes)", compiled by The Society of Synthetic Organic Chemistry, Japan, 1970. Specific examples of these dyes include azo dyes, metal complex azo dyes, pyrazolones azo dyes, naphthoquinone dyes, anthraquinone dyes, phthalocyanine dyes, carbonium dyes, quinonimine dyes, methine dyes, cyanine dyes, squarilium dyes, pyrilium salts, and metal thiolate complexes.

Preferred examples of these dyes include cyanine dyes as disclosed in JP-A-58-125246, JP-A-59-84356 and JP-A-60-78787, methine dyes as disclosed in JP-A-58-173696, JP-A-58-181690 and JP-A-58-194595, naphthoquinone dyes as disclosed in JP-A-58-112793, JP-A-58-224793, JP-A-59-48187, JP-A-59-73996, JP-A-60-52940 and JP-A-60-63744, squarilium dyes as disclosed in JP-A-58-112792, and cyanine dyes as disclosed in British Patent No. 434,875.

Near infrared-absorbing sensitizers disclosed in U.S. Pat. No. 5,156,938, too, are preferably used. Further, substituted arylbenzo(thio)pyrilium salts disclosed in U.S. Pat. No. 3,881,924, trimethine thiapyrilium salts disclosed in JP-A-57-142645 (U.S. Pat. No. 4,327,169), pyrilium-based compounds disclosed in JP-A-58-181051, JP-A-58-220143, JP-A-59-41363, JP-A-59-84248, JP-A-59-84249, JP-A-59-146063 and JP-A-59-146061, cyanine dyes disclosed in JP-A-59-216146, pentanethine thiopyrilium salts disclosed in U.S. Pat. No. 4,283,475, and pyrilium compounds disclosed in JP-B-5-13514 and JP-B-5-19702. Further preferred examples of dyes employable herein include near infrared-absorbing dyes described as compounds of formulae (I) and (II) in U.S. Pat. No. 4,756,993.

Other preferred examples of the infrared-absorbing dye of the invention include specific indolenine cyanine dyes disclosed in JP-A-2002-278057 exemplified below.

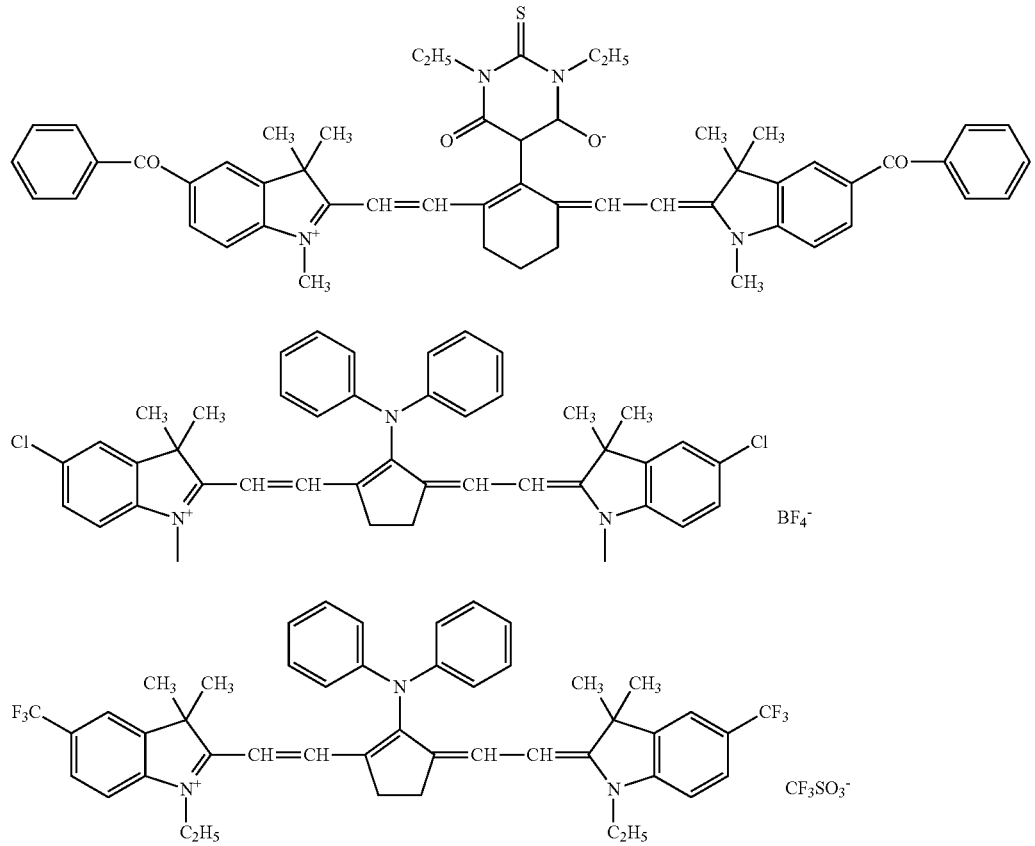

Particularly preferred among these dyes are cyanine dyes, squarilium dyes, pyrilium dyes, nickel thiolate complexes, and indolenine cyanine dyes. Even more desirable among these dyes are cyanine dyes and indolenine cyanine dyes. A particularly preferred example of these dyes is a cyanine dye represented by the following formula (III).

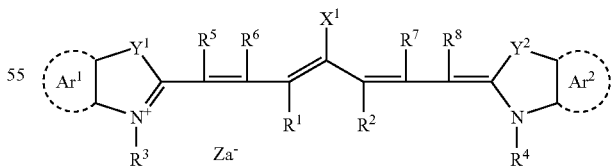

In formula (III), $X^1$ represents a hydrogen atom, halogen atom, —$NPh_2$, $X^2$-$L^1$ or a group shown below. $X^2$ represents an oxygen atom, nitrogen atom or sulfur atom and $L^1$ represents a hydrocarbon group having from 1 to 12 carbon atoms, an aromatic ring having hetero atoms or a $C_1$-$C_{12}$ hydrocarbon group containing hetero atoms. The hetero atom indicates N, S, O, halogen atom or Se.

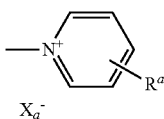

$Xa^-$ has the same meaning as $Za^-$ described later. $R^a$ represents a substituent selected from the group consisting of hydrogen atom, alkyl group, aryl group, substituted or unsubstituted amino group and halogen atom.

$R^1$ and $R^2$ each independently represent a $C_1$-$C_{12}$ hydrocarbon group. From the standpoint of storage stability of recording layer-coating solution, $R^1$ and $R^2$ each are preferably a hydrocarbon group having two or more carbon atoms. It is particularly preferred that $R^1$ and $R^2$ be connected to each other to form a 5- or 6-membered ring.

$Ar^1$ and $Ar^2$ may be the same or different and each represent an aromatic hydrocarbon group which may have substituents. Preferred examples of the aromatic hydrocarbon group include benzene ring and naphthalene ring. Preferred examples of the substituents include hydrocarbon group having 12 or less carbon atoms, halogen atom, and alkoxy group having 12 or less carbon atoms. $Y^1$ and $Y^2$ may be the same or different and each represent a sulfur atom or a dialkyl methylene group having 12 or less carbon atoms. $R^3$ and $R^4$ may be the same or different and each represent a hydrocarbon group having 20 or less carbon atoms which may have substituents. Preferred examples of the substituents include alkoxy group having 12 or less carbon atoms, carboxyl group and sulfo group. $R^5$, $R^6$, $R^7$ and $R^8$ may be the same or different and each represent a hydrogen atom or a hydrocarbon group having 12 or less carbon atoms, preferably a hydrogen atom from the standpoint of availability of starting material. $Za^-$ represents a counter anion. However, when the cyanine dye represented by formula (III) has anionic substituents in its structure, eliminating the necessity of neutralizing electric charge, $Za^-$ is not needed. From the standpoint of storage stability of recording layer-coating solution, $Za^-$ is preferably a halogen ion, perchlorate ion, tetrafluoroborate ion, hexafluorophosphate ion or sulfonate ion, particularly a perchlorate ion, hexafluorophosphate ion or arylsulfonate ion.

Specific examples of the cyanine dye represented by formula (III) which can be used to advantage in the invention include those described in JP-A-2001-133969, paragraph (0017)-(0019).

Particularly preferred examples of the cyanine dye include specific indolenine cyanine dyes described in the above cited JP-A-2002-278057.

As the pigment of the invention there may be used any of commercial available pigments and pigments disclosed in Handbook of Color Index (C. I.), "Saishin Ganryo Binran (Handbook of Modern Pigments)", Japan Association of Pigment Technology, 1977, "Saishin Ganryo Oyo Gijutsu (Modern Pigment Application Technology)", CMC, 1986, and "Insatsu Inki Gijutsu (Printing Ink Technology)", CMC, 1984.

Examples of the pigment employable herein include black pigments, yellow pigments, orange pigments, brown pigments, red pigments, purple pigments, blue pigments, green pigments, fluorescent pigments, metal powder pigments, and polymer-bonded dyes. Specific examples of these pigments include insoluble azo pigments, azo lake pigments, condensed azo pigments, chelate azo pigments, phthalocyanine-based pigments, anthraquinone-based pigments, perylene-based pigments, perinone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments, and carbon black. Preferred among these pigments is carbon black. These pigments may or may not be subjected to surface treatment before use. Examples of the surface treatment method include a method which comprises coating the surface of the pigment with a resin or wax, a method which comprises attaching a surface active agent to the pigment, and a method which comprises bonding a reactive material (e.g., silane coupling agent, epoxy compound, polyisocyanate) to the surface of the pigment. For the details of the aforementioned surface treatment method, reference can be made to "Kinzoku Sekken no Seishitsu to Oyo (Properties and Application of Metal Soaps)", Saiwai Shobo, "Insatsu Inki Gijutsu (Printing Ink Technology)", CMC, 1984, and "Saishin Ganryo Oyo Gijutsu (Modern Pigment Application Technology)", CMC, 1986.

The particle diameter of the pigment is preferably from 0.01 μm to 10 μm, more preferably from 0.05 μm to 1 μm, particularly from 0.1 μm to 1 μm. When the particle diameter of the pigment falls within the above defined range, a good stability of the pigment dispersion in the image recording layer coating solution and a good uniformity of the image recording layer can be obtained.

As the method for dispersing the pigment there may be used any known dispersing technique for use in the production of ink or toner. Examples of the dispersing machine employable herein include ultrasonic dispersing machine, sand mill, attritor, pearl mill, supermill, ball mill, impeller, disperser, KD mill, colloid mill, dynatron, three-roll mill, and pressure kneader. For the details of the dispersing technique, reference can be made to "Saishin Ganryo Oyo Gijutsu (Modern Pigment Application Technology)", CMC, 1986.

These infrared absorbents may be incorporated in the same layer with other components or in a layer provided separately of other components. These infrared absorbents are incorporated in such an arrangement that the resulting negative-working lithographic printing plate precursor comprises an image recording layer having an absorbance of from 0.3 to 1.2, preferably from 0.4 to 1.1 as determined by a reflection method at a maximal absorption wavelength in a range of from 760 nm to 1,200 nm. When the absorbance of the image recording layer falls within the above defined range, the polymerization reaction can proceed uniformly along the depth of the image recording layer, making it possible to provide the image area with a good film strength and a good adhesion to the support.

The absorbance of the image recording layer can be properly adjusted by the amount of the infrared absorbent to be incorporated in the image recording layer and the thickness of the image recording layer. The measurement of absorbance can be conducted by any ordinary method. Examples of the method of measuring absorbance employable herein include a method which comprises forming an image recording layer on a reflective support such as aluminum sheet in such an arrangement that the dried spread gives a thickness properly determined within a range required for lithographic printing plate, and then measuring the reflection density of the image recording layer thus formed using an optical densitometer, and a method involving the measurement by means of a spectrophotometer employing a reflection method using an integrating sphere.

<(B) Polymerization Initiator>

The polymerization initiator to be used in the invention is a compound which, when acted on by either or both of an optical energy and a thermal energy, generates radicals to initiate and promote the polymerization of a compound having a polymerizable unsaturated group. As the polymerization initiator to be used herein there may be used a known heat polymerization initiator, a compound having a bond with a small bond dissociation energy, a photopolymerization initiator or the like. In particular, the polymerization initiator which can be preferably used in the invention is a compound which, when acted on by a thermal energy, generates radicals to initiate and promote the polymerization of a compound having a polymerizable unsaturated group.

The polymerization initiator to be used in the invention will be further described hereinafter. These polymerization initiators may be used singly or in combination of two or more thereof.

Examples of the polymerization initiator employable herein include organic halogenated compounds, carbonyl compounds, organic peroxide compounds, azo-based polymerization initiators, azide compounds, metalocene compounds, hexaryl biimidazole compounds, organic boric acid compounds, disulfonic acid compounds, oxime ester compounds, and onium salt compounds.

Specific examples of the aforementioned organic halogenated compounds include compounds disclosed in Wakabayashi, et al, "Bull. Chem. Soc. Japan", 42, 2924 (1969), U.S. Pat. No. 3,905,815, JP-B-46-4605, JP-A-48-36281, JP-53-133428, JP-A-55-32070, JP-A-60-239736, JP-A-61-169835, JP-A-61-169837, JP-A-62-58241, JP-A-62-212401, JP-A-63-70243, JP-A-63-298339, and M. P. Hutt, "Journal of Heterocyclic Chemistry", 1 (No. 3), 1970. Particularly preferred among these compounds are, oxazole compounds and S-triazine compounds substituted by trihalomethyl group.

Even more desirable among the aforementioned compounds s-triazine derivatives comprising at least one mono, di or tri-halogen-substituted methyl group connected to s-triazine ring. Specific examples of the s-triazine derivatives include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-(1-(p-methoxyphenyl)-2,4-butadienyl)-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-1-propyl oxystyryl)-4,6-bis(trichloromethyl)-s-triazine, 2-(p-tollyl)-4,6-bis(trichloromethyl)-s-triazine, 2-(4-natoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine.

Examples of the aforementioned carbonyl compound include benzophenone derivatives such as benzophenone, Michler's ketone, 2-methylbenzophenone, 3-methyl benzophenone, 4-methylbenzophenone, 2-chloro benzophenone, 4-bromobenzophenone and 2-carboxybenzophenone, acetophenone derivatives such as 2,2-dimethoxy-2-phenylacetophenone, 2,2-diethoxy acetophenone, 1-hydroxycyclohexylphenylketone, α-hydroxy-2-methylphenylpropanone, 1-hydroxy-1-methylethyl-(p-isopropylphenyl)ketone, 1-hydroxy-1-(p-dodecyl phenyl)ketone, 2-methyl-(4'-(methylthio)phenyl)-2-morpholine-1-propanone and 1,1,1-trichloromethyl-(p-butylphenyl)ketone, thioxanthone derivatives such as thioxanthone, 2-ethylthioxanthone, 2-isopropyl thioxanthone, 2-chlorothioxanthone, 2,4-dimethyl thioxanthone, 2,4-diethylthioxanthone and 2,4-diisopropylthioxanthone, and benzoic acid ester derivatives such as p-dimethylaminobenzoic acid ethyl and p-diethylaminobenzoic acid ethyl.

As the aforementioned azo compound there may be used an azo compound as disclosed in JP-A-8-108621.

Examples of the aforementioned organic peroxide compound employable herein include trimethylcyclohexanone peroxide, acetylacetone peroxide, 1,1-bis(tert-butylperoxy)-3,3),5-trimethyl cyclohexane, 1,1-bis(tert-butylperoxy)cyclohexane, 2,2-bis(tert-butylperoxy)butane, tert-butyl hydroperoxide, cumene hydroperoxide, diisopropyl benzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy) hexane, 2,5-oxanoyl peroxide, succinic acid peroxide, benzoyl peroxide, 2,4-dichlorobenzoyl peroxide, diisopropyl peroxy carbonate, di-2-ethylhexyl peroxy dicarbonate, di-2-ethoxyethyl peroxy carbonate, dimethoxyisopropyl peroxy carbonate, di(3-methyl-3-methoxybutyl)peroxy carbonate, tert-butylperoxy acetate, tert-butylperoxy pivalate, tert-butyl peroxy neodecanoate, tert-butylperoxy octanoate, tert-butylperoxy laurate, tertiary carbonate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyldi (t-butylperoxy dihydrogen diphthalate), and carbonyldi(t-hexylperoxy dihydrogen diphthalate).

Examples of the aforementioned metalocene compound employable herein include various titanocene compounds disclosed in JP-A-59-152396, JP-A-61-151197, JP-A-63-41484, JP-A-2-249, JP-A-2-4705 and JP-A-5-83588, e.g., di-cyclopentadienyl-Ti-bis-phenyl, di-cyclopentadienyl-Ti-bis-2,6-difluorophene-1-il, di-cyclopentadienyl-Ti-bis-2,4-di-fluorophene-1-il, di-cyclopentadienyl-Ti-bis-2,4,6-trifluorophene-1-il, di-cyclopentadienyl-Ti-bis-2,3,5,6-tetrafluorophene-1-il, di-cyclopentadienyl-Ti-bis-2,3,4,5,6-pentafluorophene-1-il, di-methylcyclopentadienyl-Ti-bis-2,6-difluorophene-1-il, di-methylcyclo pentadienyl-Ti-bis-2,4,6-trifluorophene-1-il, di-methylcyclopentadienyl-Ti-bis-2,3,5,6-tetrafluorophene-1-il, di-methylcyclopentadienyl-Ti-bis-2,3,4,5,6-pentafluorophene-1-il, and iron-allene complex disclosed in JP-A-1-304453 and JP-A-1-152109.

Examples of the aforementioned hexaaryl biimidazole compound employable herein include various compounds disclosed in JP-B-6-29285, U.S. Pat. Nos. 3,479,185, 4,311,783 and 4,622,286, e.g., 2,2'-bis (o-chlorophenyl)-4,4',5,5'-tetraphenylbiimidazole, 2,2'-bis(o-bromophenyl)-4,4',5,5'-tetraphenyl biimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenyl biimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-trifluoro phenyl)-4,4',5,5'-tetraphenylbiimidazole.

Examples of the aforementioned organic boron employable herein include organic boric acid salts as disclosed in JP-A-62-143044, JP-A-62-150242, JP-A-9-188685, JP-A-9-188686, JP-A-9-188710, JP-A-2000-131837, JP-A-2002-107916, Japanese Patent No. 2764769, JP-A-2002-116539, and Kunz, Martin, "Rad Tech'98. Proceeding Apr. 19-22", 1998, Chicago, organic boron-sulfonium complexes or organic boron-oxosulfonium complexes as disclosed in JP-A-6-157623, JP-A-6-175564 and JP-A-6-175561, organic boron-iodonium complexes as disclosed in JP-A-6-

175554 and JP-A-6-175553, organic boron-phosphonium complexes as disclosed in JP-A-9-188710, and organic boron-transition metal coordinated complexes as disclosed in JP-A-6-348011, JP-A-7-128785, JP-A-7-140589, JP-A-7-306527 and JP-A-7-292014.

Examples of the aforementioned disulfone compound employable herein include compounds as disclosed in JP-A-61-166544 and JP-A-2003-328465.

For the details of the aforementioned oxime ester compound, reference can be made to J. C. S. Perkin II (1979) 1653-1660, J. C. S. Perkin II (1979) 156-162, Journal of Photopolymer Science and Technology (1995) 202-232, JP-A-2000-66385, and JP-A-2000-80068. Specific examples of these compounds include those having the following structural formulae.

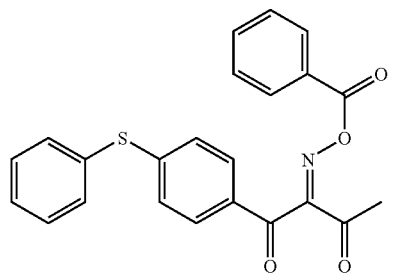

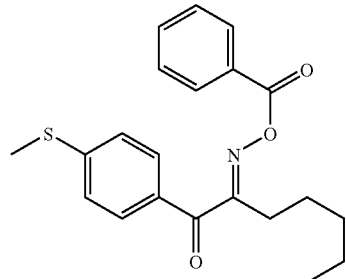

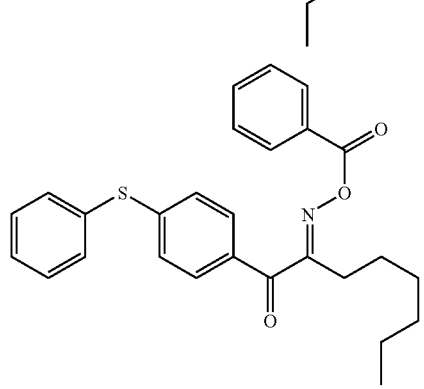

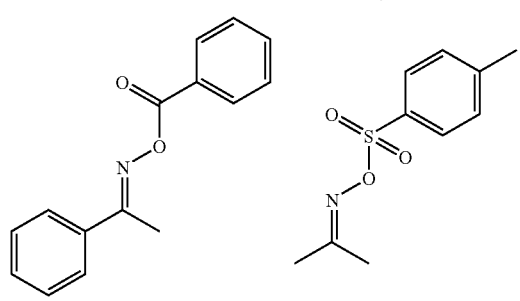

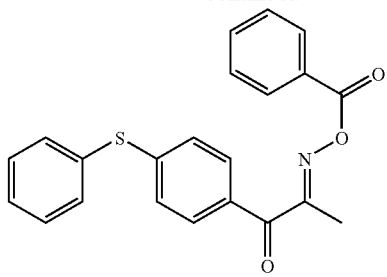

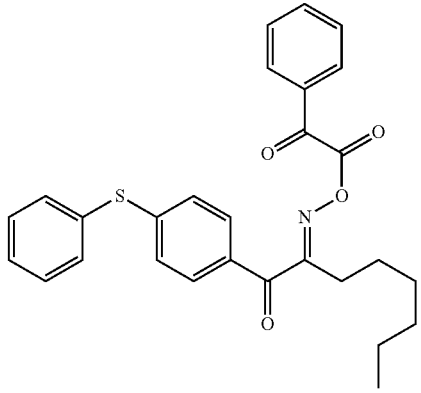

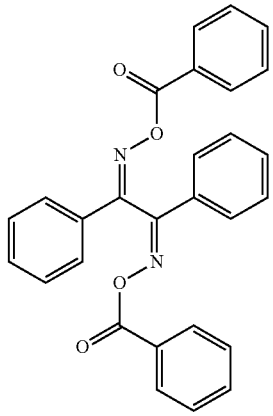

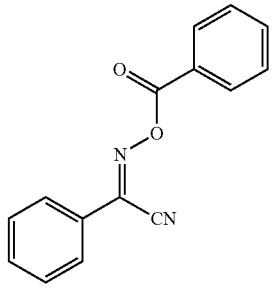

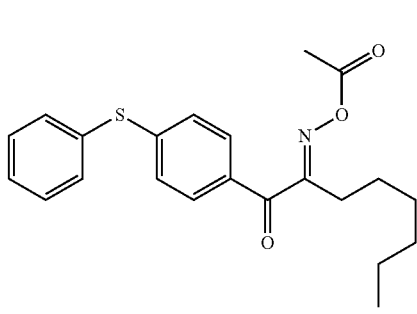

-continued

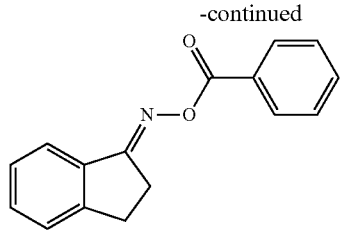
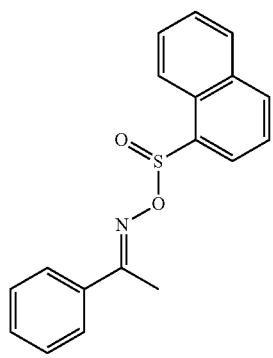
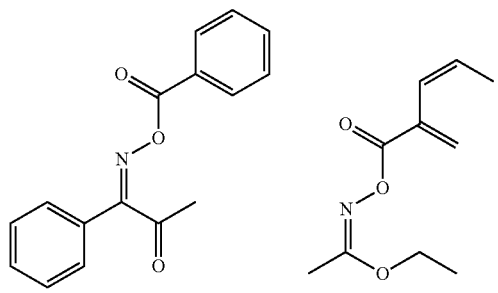
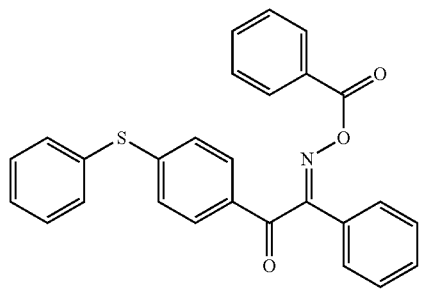
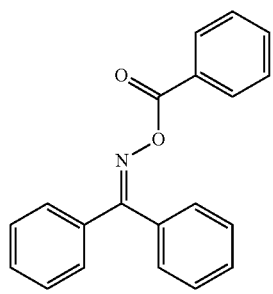

-continued

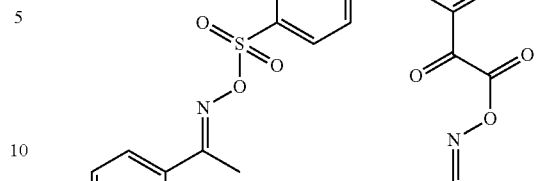
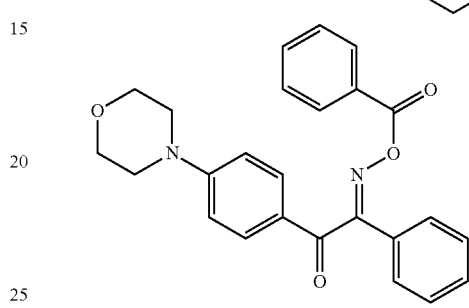
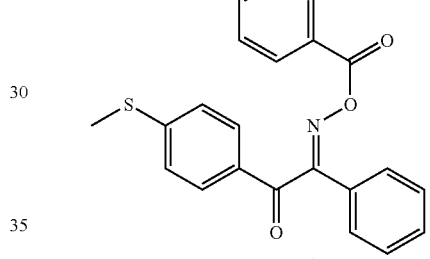
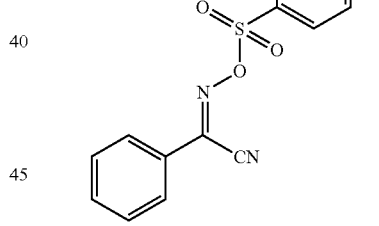

Examples of the aforementioned onium salt compound employable herein include diazonium salts as disclosed in S. I. Schlesinger, "Photogr. Sci. Eng.", 18, 387 (1974) and T. S. Bal et al, "Polymer", 21, 423 (1980), ammonium salts as disclosed in U.S. Pat. No. 4,069,055 and JP-A-4-365049, phosphonium salts as disclosed in U.S. Pat. Nos. 4,069,055 and 4,069,056, iodonium salts as disclosed in European Patent No. 104,143, U.S. Pat. Nos. 339,049 and 410,201, JP-A-2-150848, and JP-A-2-296514, sulfonium salts as disclosed in European Patent Nos. 370,693, 390,214, 233,567, 297,443 and 297,442, U.S. Pat. Nos. 4,933,377, 161,811, 410,201, 339,049, 4,760,013, 4,734,444 and 2,833,827, and German Patent Nos. 2,904,626, 3,604,580 and 3,604,581, selenonium salts as disclosed in J. V. Crivello et al, "Macromolecules", 10 (6), 1307 (1977) and J. V. Crivello et al, "J. Polymer Sci., Polymer Chem. Ed.", 17, 1047 (1979), and arsonium salts as disclosed in C. S. Wen et al, "The, Proc. Conf. Rad. Curing ASIA", page 478, Tokyo, October 1988.

Particularly preferred among these compounds from the stand point of reactivity and stability are oxime ester compounds or onium salts (e.g., diazonium salt, iodonium salt, sulfonium salt). In the invention, these onium salts act as ionic radical polymerization initiator rather than acid generator.

Examples of the onium salt which is preferably used in the invention include onium salts represented by the following formulae (RI-I) to (RI-III).

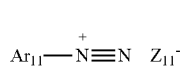
(RI-I)

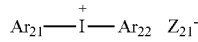
(RI-II)

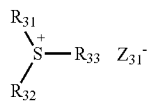
(RI-III)

In formula (RI-I), $Ar_{11}$ represents an aryl group having 20 or less carbon atoms which may have from 1 to 6 substituents. Preferred examples of these substituents include $C_1$-$C_{12}$ alkyl group, $C_1$-$C_{12}$ alkenyl group, $C_1$-$C_{12}$ alkinyl group, $C_1$-$C_{12}$ aryl group, $C_1$-$C_{12}$ alkoxy group, $C_1$-$C_{12}$ aryloxy group, halogen atom, $C_1$-$C_{12}$ alkylamino group, $C_1$-$C_{12}$ dialkylamino group, $C_1$-$C_{12}$ alkylamide group or arylamide group, carbonyl group, carboxyl group, cyano group, sulfonyl group, $C_1$-$C_{12}$ thioalkyl group, and $C_1$-$C_{12}$ thioaryl group. $Z_{11}^-$ represents a monovalent cation such as halogen ion, perchlorate ion, hexafluorophosphate ion, tetrafluoroborate ion, sulfinate ion, sulfonate ion, thiosulfonate ion and sulfate ion. Preferred among these cations are perchlorate ion, hexafluorophosphate ion, tetrafluoroborate ion, sulfonate ion and sulfinate ion from the standpoint of stability.

In formula (RI-II), $Ar_{21}$ and $Ar_{23}$ each independently represent an aryl group having 20 or less carbon atoms which may have from 1 to 6 substituents. Preferred examples of these substituents include $C_1$-$C_{12}$ alkyl group, $C_1$-$C_{12}$ alkenyl group, $C_1$-$C_{12}$ alkinyl group, $C_1$-$C_{12}$ aryl group, $C_1$-$C_{12}$ alkoxy group, $C_1$-$C_{12}$ aryloxy group, halogen atom, $C_1$-$C_{12}$ alkylamino group, $C_1$-$C_{12}$ dialkylamino group, $C_1$-$C_{12}$ alkylamide group or arylamide group, carbonyl group, carboxyl group, cyano group, sulfonyl group, $C_1$-$C_{12}$ thioalkyl group, and $C_1$-$C_{12}$ thioaryl group. $Z_{21}^-$ represents a monovalent cation such as halogen ion, perchlorate ion, hexafluorophosphate ion, tetrafluoroborate ion, sulfonate ion, sulfinate ion, thiosulfonate ion and sulfate ion. Preferred among these cations are perchlorate ion, hexafluorophosphate ion, tetrafluoroborate ion, sulfonate ion, sulfinate ion and carboxylate ion from the standpoint of stability and reactivity.

In formula (RI-III), R31, R32 and R33 each independently represent an aryl, alkyl, alkenyl or alkinyl group having 20 or less carbon atoms which may have from 1 to 6 carbon atoms. Preferred among these groups is aryl group from the standpoint of reactivity and stability. Preferred examples of the substituents include $C_1$-$C_{12}$ alkyl group, $C_1$-$C_{12}$ alkenyl group, $C_1$-$C_{12}$ alkinyl group, $C_1$-$C_{12}$ aryl group, $C_1$-$C_{12}$ alkoxy group, $C_1$-$C_{12}$ aryloxy group, halogen atom, $C_1$-$C_{12}$ alkylamino group, $C_1$-$C_{12}$ dialkylamino group, $C_1$-$C_{12}$ alkylamide group or arylamide group, carbonyl group, carboxyl group, cyano group, sulfonyl group, $C_1$-$C_{12}$ thioalkyl group, and $C_1$-$C_{12}$ thioaryl group. $Z_{31}^-$ represents a monovalent cation such as halogen ion, perchlorate ion, hexafluorophosphate ion, sulfonate ion, sulfinate ion, thiosulfonate ion, sulfate ion and carboxylate ion. Preferred among these cations are perchlorate ion, hexafluorophosphate ion, tetrafluoroborate ion, sulfonate ion, sulfinate ion and carboxylate ion from the standpoint of stability and reactivity. Particularly preferred are carboxylate ions as disclosed in JP-A-2001-343742. Even more preferably, carboxylate ions as disclosed in JP-A-2002-148790 are used.

Specific examples of the onium salts which can be preferably used in the invention will be given below, but the invention is not limited thereto.

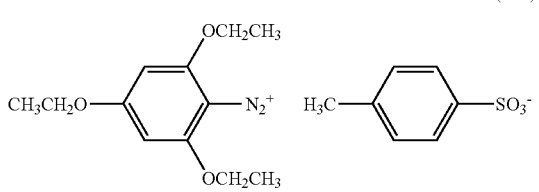
(N-1)

(N-2)
$PF_6^-$

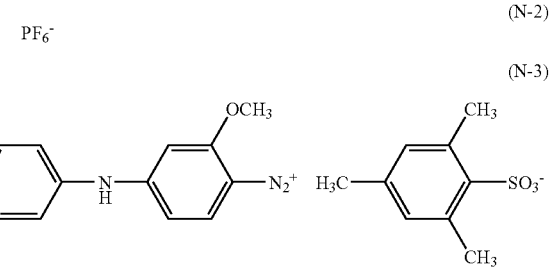
(N-3)

(N-4)
$ClO_4^-$ (N-5)
$PF_6^-$

(N-6)

(N-7)
$BF_4^-$

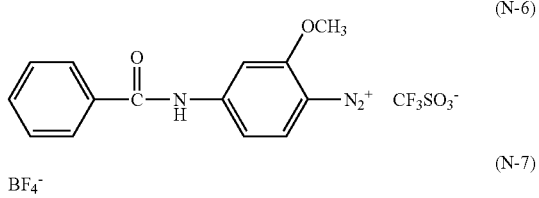
(N-8)

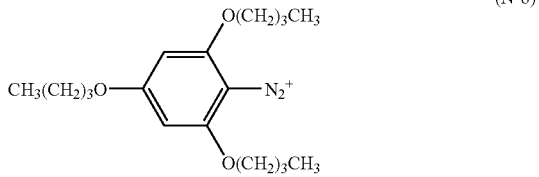
(N-9)
$ClO_4^-$

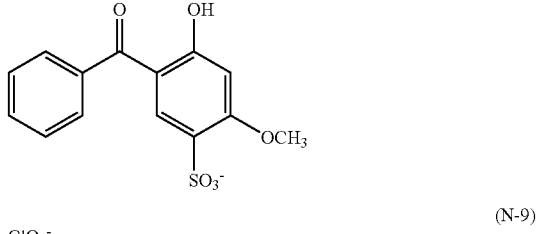
(N-10)

(chemical structure page - counter ions and anion/cation examples N-11 through N-17 and I-1 through I-15)

-continued (I-17)

[Structure: Diphenyliodonium with O(CH₂)₇CH₃ substituent; counterion 2,4,6-triisopropylbenzenesulfonate]

CF₃COO⁻ (I-18)

CF₃SO₃⁻ (I-19)

H₃C-C₆H₄-CH₂COO⁻ (I-20)

(I-21)
[Structure: Phenyl-(4-O(CH₂)₅CH₃-phenyl)iodonium; counterion p-toluenesulfonate]
H₃C-C₆H₄-SO₃⁻

(I-22)
[Structure: (4-hexylphenyl)(4-pentyloxyphenyl)iodonium; counterion p-toluenesulfonate]
CH₃(CH₂)₅-C₆H₄-I⁺-C₆H₄-O(CH₂)₅CH₃
H₃C-C₆H₄-SO₃⁻

(I-23)
[Structure: Bis(3-chlorophenyl)iodonium BF₄⁻]

(I-24)
H₃C-C₆H₄-SO₃⁻

(I-25)
C₆H₅-COO⁻

(S-1)
[Structure: Triphenylsulfonium p-toluenesulfonate]

PF₆⁻ (S-2)

ClO₄⁻ (S-3)

(S-4)
[Structure: Pentafluorobenzenesulfonate]

(S-5)
C₆H₅-COCOO⁻

CF₃SO₃⁻ (S-6)

(S-7)
[Structure: Saccharinate (1,2-benzisothiazol-3(2H)-one 1,1-dioxide anion)]

(S-8)
C₆H₅-SO₂S⁻

(S-9)
C₆H₅-COO⁻

(S-10)
[Structure: 2,4,6-triisopropylbenzenesulfonate]

(S-11)
[Structure: Bis(4-chlorophenyl)phenylsulfonium; counterion C₆H₅-COCOO⁻]

(S-12)
H₃C-C₆H₄-CH₂COO⁻

(S-13)
[Structure: Diphenylglycolate, (C₆H₅)₂C(OH)COO⁻]

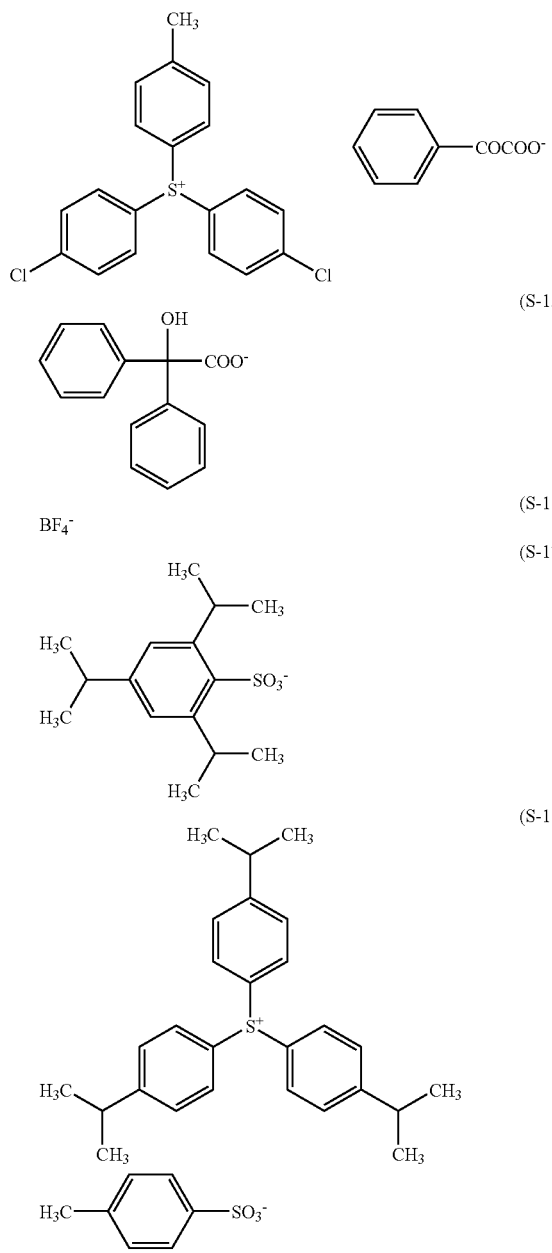

(S-14)

(S-15)

(S-16)

(S-17)

(S-18)

These polymerization initiators may be incorporated in an amount of from 0.1 to 50% by weight, preferably from 0.5 to 30% by weight, particularly from 1 to 20% by weight based on the total solid content constituting the image recording layer. When the amount of the polymerization initiators to be incorporated falls within this range, a good sensitivity and a good stain resistance of the non-image area during printing can be obtained. These polymerization initiators may be used singly or in combination of two or more thereof. These polymerization initiators may be incorporated in the same layer with other components or in a layer provided separately of other components.

<(C) Polymerizable Compound>

The polymerizable compound which can be used in the invention is an addition-polymerizable compound having at least one ethylenically unsaturated double bond and is selected from the group consisting of compounds having at least one, preferably two ethylenically unsaturated bonds. Such a group of compounds are widely known in the art and can be used in the invention without any particular limitation.

These compounds have a chemical morphology such as monomer, prepolymer, e.g., dimer, trimer, oligomer, mixture and copolymer thereof. Examples of the monomer and copolymer thereof include unsaturated carboxylic acids (e.g., acrylic acid, methacrylic acid, itaconic acid, crotonic acid, isocrotonic acid, maleic acid), and esters and amides thereof. Esters of unsaturated carboxylic acid with aliphatic polyvalent alcohol compound and amides of unsaturated carboxylic acid with aliphatic polyvalent amine compound are preferably used. Other preferred examples of copolymers employable herein include product of addition reaction of unsaturated carboxylic acid ester or amide having a nucleophilic substituent such as hydroxyl group, amino group and mercapto group with monofunctional or polyfunctional isocyanate or epoxy and product of dehydrocondensation reaction of such an unsaturated carboxylic acid ester or amide with monofunctional or polyfunctional carboxylic acid. Further examples of copolymers employable herein include product of addition reaction of unsaturated carboxylic acid ester or amide having an electrophilic substituent such as isocyanate group and epoxy group with monofunctional or polyfunctional alcohol, amine or thiol and product of substitution reaction of unsaturated carboxylic acid ester or amide having a separatable substituent such as halogen group and tosyloxy group with monofunctional or polyfunctional alcohol, amine or thiol. Still further examples of copolymers employable herein include compounds produced in the same manner as described above except that the aforementioned unsaturated carboxylic acid is replaced by unsaturated phosphonic acid, styrene, vinylether or the like.

Specific examples of the monomer of ester of aliphatic polyvalent alcohol compound with unsaturated carboxylic acid include acrylic acid esters such as ethylene glycol diacrylate, triethylene glycol diacrylate, 1,3-butanediol diacrylate, tetramethyelne glycol diacrylate, propylene glycol diacrylate, neopentyl glycol diacrylate, trimethylolpropane triacrylate, trimethylolpropane tri(acryloyloxy propyl)ether, trimethylolethane triacrylate, hexanediol diacrylate, 1,4-cyclohexanediol diacylate, tetraethylene glycol diacrylate, pentaerythritol diacrylate, pentaerythritol triacrylate, pentaerythritol tetraacrylate, dipentaerythritol diacrylate, dipentaeruthritol hexaacrylate, sorbitol triacrylate, sorbitol tetraacrylate, sorbitol pentaacrylate, sorbitol hexaacrylate, tri(acryloxyethyl)isocyanurate, polyester acrylate oligomer and EO-modified triacrylate isocyanurate.

Methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis(p-(3-methacryloxy-2-hydroxypropoxy)phenyl)dimethyl methane and bis-(p-(methacryloxyethoxy)phenyl) dimethylmethane.

Itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate, crotonic acid esters such as ethylene glycol dicrotonate, tetramethylene glycol dicrotonate, pentaerythritol dicrotonate and sorbitol tetradicrotonate, isocrotonic acid esters such as ethylene glycol diisocrotonate, pentaerythritol diisocrotonate and sorbitol tetraisocrotonate, and maleic acid esters such as ethylene glycol dimalate, triethylene glycol dimalate, pentaerythritol dimalate and sorbitol tetramalate.

Other preferred examples of esters employable herein include aliphatic alcohol-based esters as disclosed in JP-B-51-47334 and JP-A-57-196231, esters having an aromatic skeleton as disclosed in JP-A-59-5240, JP-A-59-5241 and JP-A-2-226149, and esters having an amino group as disclosed in JP-A-1-165613. Further, the aforementioned ester monomers may be used in admixture.

Specific examples of monomer of amide of aliphatic polyvalent amine compound with unsaturated carboxylic acid include methylenebis-acrylamide, methylenebis-methacrylamide, 1,6-hexamethylenebis-acrylamide, diethylene triamine trisacrylamide, xylylene bisacrylamide, and xylylene bismethacrylamide. Other preferred examples of amide-based monomers include those having a cyclohexylene structure as disclosed in JP-B-54-21726.

Urethane-based addition-polymerizable compounds produced by the addition reaction of isocyanate with hydroxyl group can be used as well. Specific examples of the urethane-based addition-polymerizable compounds employable herein include vinyl urethane compound containing two or more polymerizable vinyl groups per molecule obtained by adding a vinyl monomer having a hydroxyl group represented by the following formula (a) to a polyisocyanate compound having two or more isocyanate groups per molecule as disclosed in JP-B-48-41708.

$$CH_2=C(R_4)COOCH_2CH(R_5)OH \qquad (a)$$

wherein $R^4$ and $R^5$ each represent H or $CH_3$.

Further, urethane acrylates as disclosed in JP-A-51-37193, JP-B-2-32293 and JP-B-2-16765 and urethane compounds having an ethylene oxide-based skeleton as disclosed in JP-B-58-49860, JP-B-56-17654, JP-B-62-39417 and JP-B-62-39418 are desirable. Moreover, the use of addition-polymerizable compounds having an amino structure or sulfide structure in its molecule as disclosed in JP-A-63-277653, JP-A-63-260909 and JP-A-1-105238 makes it possible to obtain a photopolymerizable composition having an extremely high photosensitizing speed.

Other examples of esters employable herein include polyfunctional acrylates or methacrylates such as polyester acrylates as disclosed in JP-A-48-64183, JP-B-49-43191 and JP-B-52-30490 and epoxy acrylates obtained by the reaction of epoxy resin with (meth)arylic acid. Further examples of esters employable herein include unsaturated compounds as disclosed in JP-B-46-43946, JP-B-1-40337 and JP-B-1-40336, and vinylphosphonic acid-based compounds as disclosed in JP-A-2-25493. In some cases, a structure containing a perfluoroalkyl group as disclosed in JP-A-61-22048 can be used. Moreover, those referred to as "photo-setting monomer" or "photo-setting oligomer" in Journal of Japan Adhesive Industry Association, vol. 20, No. 7, pp. 300-308, 1984 can be used as well.

Referring to these addition-polymerizable compounds, their structure and details of direction such as which they are used singly or in combination and added amount can be arbitrarily predetermined according to the required performance of the final lithographic printing plate precursor. For example, these factors may be predetermined from the following standpoints of view.

In respect of sensitivity, a structure having a great content of unsaturated groups per molecule is desirable. In many cases, bifunctional or higher structure is desirable. In order to enhance the strength of the image area, i.e., hardened layer, a trifunctional or higher structure is preferably used. Further, a method which comprises the combined use of structures having different functionalities and polymerizable groups (e.g., acrylic acid ester, methacrylic acid ester, styrene-based compound, vinylether-based compound) to adjust both sensitivity and strength is useful.

Also for the compatibility and dispersibility with other components (e.g., binder polymer, initiator, colorant) in the image recording layer, the selection of and how to use addition-polymerizable compounds are important factors. For example, the use of a low purity compound or the combined use of two or more addition-polymerizable compounds can enhance the compatibility with other components. Moreover, a specific structure can be selected for the purpose of enhancing the adhesion of the substrate, overcoat layer described later, etc.

The aforementioned polymerizable compounds are preferably used in an amount of from 5 to 48% by weight, more preferably from 10 to 45% by weight based on the total solid content constituting the image recording layer. These polymerizable compounds may be used singly or in combination of two or more thereof.

In addition, referring to how to use the aforementioned polymerizable compounds, a proper structure and blended or added amount can be arbitrarily predetermined from the standpoint of magnitude of inhibition of polymerization with respect to oxygen, resolution, foggability, change of refractivity, surface adhesivity, etc. In some cases, a layer structure/coating method such as undercoating and overcoating can be executed.

<(D) Binder Polymer>

As the binder polymer to be used in the invention there may be used any of compounds known as such in the art without any limitation, preferably a polymer having film-forming properties. Examples of such a binder polymer include acrylic resins, polyvinyl acetal resins, polyurethane resins, polyurea resins, polyimide resins, polyamide resins, epoxy resins, methacrylic resins, polystyrene-based resins, novolak type phenolic resins, polyester resins, synthetic rubbers, and natural rubbers.

The binder polymer preferably may be crosslinkable to enhance the film strength of the image area. In order to render the binder polymer crosslinkable, a crosslinkable functional group such as ethylenically unsaturated bond may be introduced into the main chain or side chains of the polymer. The introduction of the crosslinkable functional group may be carried out by copolymerization.

Examples of the polymer having an ethylenically unsaturated bond in the main chain of the molecule include poly-1,4-butadiene, and poly-1,4-isoprene.

Examples of the polymer having an ethylenically unsaturated bond in the side chains of the molecule include polymers of acrylic or methacrylic acid ester or amide wherein the ester or amide residue (R in —COOR or —CONHR) has an ethylenically unsaturated bond.

Examples of the residue (R as described above) having an ethylenically unsaturated bond include —$(CH_2)_n$CR$^1$=CR$^2$R$^3$, —$(CH_2O)_n$CH$_2$CR$^1$=CR$^2$R$^3$, —$(CH_2CH_2O)_n$CH$_2$CR$^1$=CR$^2$R$^3$, —$(CH_2)_n$NH—CO—O—CH$_2$CR$^1$=CR$^2$R$^3$, —$(CH_2)_n$—O—CO—CR$^1$=CR$^2$R$^3$, and —$(CH_2CH_2O)_2$—X (in which $R^1$ to $R^3$ each represent a hydrogen atom, halogen atom or $C_1$-$C_{20}$ alkyl, aryl, alkoxy or aryloxy group; $R^1$ may be connected to $R^2$ or $R^3$ to form a ring; n represents an integer of from 1 to 10; and X represents a dicyclopentadienyl residue).

Specific examples of the ester residue include —$CH_2CH=CH_2$ (as disclosed in JP-B-7-21633), —$CH_2CH_2O$—$CH_2CH=CH_2$, —$CH_2C(CH_3)=CH_2$, —$CH_2CH=CH$—$C_6H_5$, —$CH_2CH_2OCOCH=CH$—$C_6H_5$, —$CH_2CH_2$—$NHCOO$—$CH_2CH=CH_2$, and —$CH_2CH_2O$—X (in which X represents a dicyclopentadienyl residue).

Specific examples of the amide residue include —$CH_2CH=CH_2$, —$CH_2CH_2$—Y (in which Y represents a cyclohexene residue), and —$CH_2CH_2$—OCO—$CH=CH_2$.

The crosslinkable binder polymer undergoes addition of a free radical (polymerization-initiating radical or radical growing during the polymerization of polymerizable compound) to its crosslinkable functional group, causing addition polymerization of polymers directly or via polymerization chain of polymerizable compound leading to the formation of crosslinking between polymer molecules. Thus, the crosslinkable binder polymer hardens. Otherwise, atoms (e.g., hydrogen atom on the carbon atom adjacent to the functional crosslinkable group) are extracted from the polymer by free radicals to produce polymer radicals which are then bonded to each other to form crosslinking between polymer molecules, causing the binder polymer to harden.

The content of the crosslinkable groups in the binder polymer (content of radical-polymerizable unsaturated double bonds as determined by iodometry) is preferably from 0.1 to 10.0 mmol, more preferably from 1.0 to 7.0 mmol, most preferably from 2.0 to 5.5 mmol per 1 g of binder polymer. When the content of the crosslinkable groups in the binder polymer falls within this range, a good sensitivity and a good storage stability can be obtained.

Further, from the standpoint of on-the-machine developability of unexposed area of image recording layer, the binder polymer preferably has a high solubility or dispersibility in the ink and/or dampening water.

In order to enhance the solubility or dispersibility of the binder polymer in the ink, the binder polymer is preferably lipophilic. On the contrary, in order to enhance the solubility or dispersibility of the binder polymer in the dampening water, the binder polymer is preferably hydrophilic. Therefore, it is also effective in the invention to use a lipophilic binder polymer and a hydrophilic binder polymer in combination.

Preferred examples of the hydrophilic binder polymer employable herein include those having a hydrophilic group such as hydroxyl group, carboxyl group, carboxylate group, hydroxyethyl group, polyoxyethyl group, hydroxypropyl group, polyoxypropyl group, amino group, aminoethyl group, aminopropyl group, ammonium group, amide group, carboxymethyl group, sulfonate group and phosphate group.

Specific examples of these binder polymers include gum Arabic, casein, gelatin, starch derivatives, carboxymethyl cellulose, sodium salts thereof, cellulose acetate, sodium alginate, vinyl acetate-maleic acid copolymers, styrene-maleic acid copolymers, polyacrylic acids, salts thereof, polymethacrylic acids, salts thereof, homopolymers and copolymers of hydroxyethyl methacrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzable polyvinyl acetates having a hydrolyzability of 60% by weight or more, preferably 80% by weight or more, polyvinyl formal, polyvinyl butyral, polyvinyl pyrrolidone, homopolymers and copolymers of acrylamide, homopolymers and polymers of methacrylamide, homopolymers and copolymers of N-methylolacrylamide, polyvinylpyrrolidone, alcohol-soluble nylon, and polyether of 2,2-bis-(4-hydroxyphenyl)-propane with epichlorohydrin.

The binder polymer preferably has a weight-average molecular weight of 5,000 or more, more preferably from 10,000 to 300,000, or preferably has a number-average molecular weight of 1,000 or more, more preferably from 2,000 to 250,000. The binder polymer preferably has a polydispersibility (weight-average molecular weight/number-average molecular weight) of from 1.1 to 10.

The binder polymer can be synthesized by any known method. Examples of the solvent to be used in the synthesis of the binder polymer include tetrahydrofurane, ethylene dichloride, cyclohexanone, methyl ethyl ketone, acetone, methanol, ethanol, ethylene glycol, monomethyl ether, ethylene glycol monoethyl ether, 2-methoxyethyl acetate, diethylene glycol dimethyl ether, 1-methoxy-2-propanol, 1-methoxy-2-propylacetate, N,N-dimethylformamide, N,N-dimethyl acetamide, toluene, ethyl acetate, methyl lactate, ethyl lactate, dimethyl sulfoxide, and water. These solvents may be used singly or in admixture of two or more thereof.

As the radical polymerization initiator to be used in the binder polymer there may be used any known compound such as azo-based initiator and peroxide initiator.

The content of the binder polymers is preferably from 5 to 90% by weight, more preferably from 5 to 80% by weight, even more preferably from 10 to 70% by weight based on the total solid content in the image recording layer. When the content of the binder polymers falls within this range, the resulting image area can be provided with a high strength and good image-forming properties.

Further, the polymerizable compounds and the binder polymers are preferably used at a weight ratio of from 0.5/1 to 4/1.

<Microcapsule/Microgel>

In the invention, some embodiments of the method of incorporating the image recording layer constituents in the image recording layer may be employed. One of these embodiments is a molecule-dispersed image-recording layer obtained by spreading these constituents in the form of a solution in a proper solvent as described in JP-A-2002-287334. Another embodiment is a microcapsuled image recording layer obtained by incorporating part or whole of the constituents in the image recording layer in microcapsuled form as described in JP-A-2001-277740 and JP-A-2001-277742. Further, in the microcapsuled image recording layer, the constituents may be incorporated outside the microcapsules. In a preferred embodiment of the microcapsuled image recording layer, a hydrophobic constituent is incorporated in the microcapsule and a hydrophilic constituent is incorporated in the part outside the microcapsule. In a further preferred embodiment of the microcapsuled image recording layer, a particulate crosslinked resin, i.e., microgel is incorporated in the image recording layer. The microgel may comprise a part of the constituent incorporated in the interior and/or surface thereof. In particular, a reactive microgel formed by incorporating a polymerizable compound in the surface of the microgel is preferred from the standpoint of image formation sensitivity or press life.

In order to obtain a better on-the-machine developability, the image recording layer is preferably a microcapsuled or microgel type image recording layer.

In order to microcapsule or microgel the aforementioned image recording layer constituents, any known method may be employed.

Examples of method of producing microcapsule include a method utilizing coacervation as disclosed in U.S. Pat. Nos.

2,800,457 and 2,800,458, a method involving interfacial polymerization as disclosed in U.S. Pat. No. 3,287,154, JP-B-38-19574 and JP-B-42-446, a method involving the precipitation of polymer as disclosed in U.S. Pat. Nos. 3,418,250 and 3,660,304, a method involving the use of isocyanate polyol wall material as disclosed in U.S. Pat. No. 3,796,669, a method involving the use of isocyanate wall material as disclosed in U.S. Pat. No. 3,914,511 a method involving the use of urea-formaldehyde-based or urea-formaldehyde-resorcinol-based wall-forming material as disclosed in U.S. Pat. Nos. 4,001,140, 4,087,376, and 4,089,802 a method involving the use of wall material such as melamine-formaldehyde resin and hydroxyl cellulose as disclosed in U.S. Pat. No. 4,025,445, in situ method involving monomer polymerization as disclosed in JP-B-36-9163 and JP-B-51-9079, a spray drying method as disclosed in British Patent No. 930,422 and U.S. Pat. No. 3,111,407, and an electrolytic dispersion cooling method as disclosed in British Patent Nos. 952,807 and 967,074. However, the invention is not limited to these methods.

A preferred microcapsule wall to be used in the invention has a three-dimensional crosslinking and swells with a solvent. From this standpoint of view, the microcapsule wall-forming material is preferably a polyurea, polyurethane, polyester, polycarbonate, polyamide or mixture thereof, particularly polyurea or polyurethane. The microcapsule wall may have a compound having a crosslinkable functional group such as binder polymer-introducible ethylenically unsaturated bond incorporated therein.

On the other hand, as a method of preparing microgel there may be used granulation involving interfacial polymerization described in JP-B-38-19574 and JP-B-42-446 or granulation involving non-aqueous dispersion polymer described in JP-A-5-61214. However, the invention is not limited to these methods.

As the aforementioned method utilizing interfacial polymerization there may be used the aforementioned known microcapsule producing method.

The microgel which can be preferably used in the invention is produced by granulation involving interfacial polymerization and thus has a three-dimensional crosslink. From this standpoint of view, the material to be used herein is preferably a polyurea, polyurethane, polyester, polycarbonate, polyamide or a mixture thereof, particularly polyurea or polyurethane.

The average particle diameter of the aforementioned microcapsules or microgel is preferably from 0.01 to 3.0 μm, more preferably from 0.05 to 2.0 μm, particularly from 0.10 to 1.0 μm. When the average particle diameter of the aforementioned microcapsules falls within this range, a good resolution and a good age stability can be obtained.

<Other Image Recording Layer Constituents>

The image recording layer of the invention may further comprise various compounds incorporated therein as necessary. These compounds will be further described hereinafter.

<Surface Active Agent>

In the invention, the image recording layer preferably comprises a surface active agent incorporated therein to enhance the on-the-machine developability thereof during the starting of printing and the surface properties of the coat. Examples of the surface active agent employable herein include nonionic surface active agents, anionic surface active agents, cationic surface active agents, amphoteric surface active agents, and fluorine-based surface active agents. These surface active agents may be used singly or in combination of two or more thereof.

As the nonionic surface active agent employable herein there may be used any known nonionic surface active agent without any particular limitation. Examples of the nonionic surface active agent employable herein include polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethyleneglycol fatty acid esters, polyglycerin fatty acid partial esters, polyoxyethylenated castor oils, polyoxyethylene glycerin fatty acid partial esters, fatty acid diethanolamides, N,N-bis-2-hydroxyalkylamines, polyoxyethylene alkylamine, triethanolamine fatty acid ester, trialkylamine oxide, polyethylene glycol, and copolymer of polyethylene glycol with polypropylene glycol.

The anionic surface active agent to be used in the invention is not specifically limited. Any known anionic surface active agent may be used. Examples of the anionic surface active agent employable herein include fatty acid salts, abietates, hydroxyalkanesulfonates, alkanesulfonates, dialkylsulfosuccinic acid esters, straight-chain alkylbenzenesulfonates, branched alkylbenzenesulfonates, alkylnaphthalenesulfonates, alkylphenoxypolyoxyethylenepropylsulfonates, polyoxyethylenealkylsulphenylethers, N-methyl-N-oleyl-taurine sodium salts, N-alkylsulfosuccinic acid monoamide disodium salts, petroleum sulfonates, sulfated tallow oil, sulfuric acid esters of fatty acid alkylester, alkylsulfuric acid esters, polyoxyethylenealkylethersulfuric acid esters, fatty acid monoglyceride sulfuric acid esters, polyoxyethylene-alkylphenylether sulfuric acid esters, alkylphosphoric acid esters, polyoxyethylenestyrylphenyletherphosphoric acid esters, polyoxyethylenealkylphenyletherphosphoric acid esters, partially saponified styrene/maleic anhydride copolymers, partially saponified olefin/maleic anhydride copolymers, and napthalenesulfonate-formalin condensates.

The cationic surface active agent to be used in the invention is not specifically limited. Any known cationic surface active agent may be used. Examples of the cationic surface active agent employable herein include alkylamine salts, quaternary ammonium salts, polyoxyethylenealkylamine salts, and polyethylene polyamine derivatives.

The amphoteric surface active agent to be used in the invention is not specifically limited. Any known amphoteric surface active agent may be used. Examples of the amphoteric surface active agent employable herein include carboxybetaines, aminocarboxylic acids, sulfobtaines, aminosulfuric acid esters, and imidazolines.

In the aforementioned surface active agents, the term "polyoxyethylene" may be replaced by the term "polyoxyalkyelne" such as polyoxymethylene, polyoxypropylene and polyoxybutyrene. In the invention, these surface active agents may be used as well.

Even more desirable examples of the surface active agent include fluorine-based surface active agents having a perfluoroalkyl group in its molecule. Preferred examples of such a fluorine-based surface active agent employable herein include anionic surface active agents such as perfluoroalkylcarboxylate, perfluoroalkylsulfonate and perfluoroalkylphosphoric acid ester, amphoteric surface active agents such as perfluoroalkylbetaine, cationic surface active agents such as perfluoroalkyltrimethyl ammonium salt, and nonionic surface active agents such as perfluoroalkylamine oxide, perfluoroalkyl ethylene oxide adduct, oligomer having perfluoroalkyl group and hydroxyl group, oligomer having perfluoroalkyl group and lipophilic group, oligomer having perfluoroalkyl group, hydrophilic group and lipophilic group and urethane having perfloroalkyl group and lipophilic group. Further, fluorine-based surface active agents as disclosed in JP-A-62-170950, JP-A-62-226143 and JP-A-60-168144 are preferably used.

These surface active agents may be used singly or in combination of two or more thereof. The content of the surface active agents is preferably from 0.001 to 10% by weight, more preferably from 0.01 to 5% by weight based on the total solid content in the image recording layer.

<Colorant>

In the invention, the image recording layer may further comprise various compounds incorporated therein other than these additive as necessary. For example, dyes having a great absorption in visible light range may be used as image colorants. Specific examples of these dyes employable herein include Oil Yellow #101, Oil Yellow #103, Oil Pink #312, Oil Green BG, Oil Blue BOS, Oil Blue #603, Oil Black BY, Oil Black BS, Oil Black T-505 (produced by Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes disclosed in JP-A-62-293247. Further, dyes such as phthalocyanine-based dye, azo-based dye, carbon black and titanium oxide are preferably used.

When an image is formed with these colorants, the image area and the non-image area can be easily distinguished from each other. Thus, these colorants are occasionally added auxiliarily. The amount of these colorants to be incorporated in the image recording layer is preferably from 0.01 to 10% by weight based on the total content in the image-forming material.

<Printing Agent>

In order to form a printed-out image, the image recording layer of the invention may comprise a compound incorporated therein which changes its color when acted upon by an acid or radical. Examples of such a compound which can be used to advantage include various dyes such as diphenylmethane-based dye, triphenylmethane-based dye, thiazine-based dye, oxazine-based dye, xanthene-based dye, anthraquinone-based dye, iminoquinone-based dye, azo-based dye and azomethine-based dye.

Specific examples of these dyes employable herein include dyes such as Brilliant Green, Ethyl Violet, Methyl Green, Crystal Violet, Basic Fuchsine, Methyl Violet 2B, Quinacridone Red, Rose Bengal, Metanil Yellow, Thymol Sulfophthalein, Xylenol Blue, Methyl Orange, Paramethyl Red, Congo Red, Benzopurpurine 4B, α-Naphthyl Red, Nile Blue 2B, Nile blue A, Methyl Violet, Malachite Green, Parafuchsine, Victoria Pure Blue BOH (produced by HODOGAYA CHEMICAL CO., LTD.), Oil Blue #603 (produced by Orient Chemical Industries, Ltd.), Oil Pink #312 (produced by Orient Chemical Industries, Ltd.), Oil Red 5B (produced by Orient Chemical Industries, Ltd.), Oil Scarlet #308 (produced by Orient Chemical Industries, Ltd.), Oil Red OG (produced by Orient Chemical Industries, Ltd.), Oil Red RR (produced by Orient Chemical Industries, Ltd.), Oil Green #502 (produced by Orient Chemical Industries, Ltd.), Spiron Red BEH Special (produced by HODOGAYA CHEMICAL CO., LTD.), m-Cresol Purple, Cresol Red, Rhodamine B, Rhodamine 6G, Sulfo Rhodamine B, Auramine, 4-p-diethylaminophenyliminonaphthoquinone, 2-carboxyanilino-4-p-diethylaminophenylimino naphthoquinone, 2-carboxystearylamino-4-p-N,N-bis(hydroxyethyl)aminophenyliminonaphthoquinone, 1-phenyl-3-methyl-4-p-diethylaminophenylimino-5-pyrazolones and 1-β-naphthyl-4-p-diethylaminophenyl imino-5-pyrazolone, and leuco dyes such as p,p',P'''-hexamethyltriamiotriphenylmethane (leucocrystal violet) and Pergascript Blue SRB (produced by Ciba Geigy Inc.).

Other examples of dyes employable herein include leuco dyes known as material of heat-sensitive paper and pressure-sensitive paper. Specific examples of these leuco dyes employable herein include Crystal Violet Lactone, Malachite Green Lactone, Benzoyl Leuco Methylene Blue, 2-(N-phenyl-N-methylamino)-6-(N-p-tollyl-N-ethyl)amino-fluorane, 2-anilino-3-methyl-6-(N-ethyl-p-toluidino)fluorine, 3,6-dimethoxyfluorane, 3-(N,N-diethylamino)-5-methyl-7-(N,N-dibenzylamino)-fluorine, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino) fluorine, 3-(N,N-diethylamino)-7-chlorofluorane, 3-(N,N-diethylamino)-7-benzyl aminofluorane, 3-(N,N-diethylamino)-7,8-benzofluorane, 3-(N,N-dibutylamino)-6-methyl-7-anilidinofluorane, 3-(N,N-dibutylamino)-6-methyl-7-xylidilidinofluorane, 3-piperidino-6-methyl-7-anilinofluorane, 3-pyrrolidino-6-methyl-7-anilinofluorane, 3,3-bis(1-ethyl-2-methylndole-3-il) phthalide, 3,3-bis(1-n-butyl-2-methylindole-3-il) phthalide, 3,3-bis(p-dimethylaminophenyl)-6-dimethyl aminophthalide, 3-(4-diethylamino-2-ethoxyphenyl)-3-(1-ethyl-2-methylindole-3-il)-4-xaphthalide, and 3-(4-diethylaminophenyl)-3-(1-ethyl-2-methylindole-3-il) phthalide.

The added amount of the dyes which changes its color when acted upon by an acid or radical are each from 0.01 to 10% by weight based on the solid content in the image recording layer.

<Polymerization Inhibitor>

The image recording layer of the invention preferably comprises a small amount of a heat polymerization inhibitor incorporated therein to inhibit unnecessary heat polymerization of radical-polymerizable compounds during the production or storage thereof.

Preferred examples of the heat polymerization inhibitor employable herein include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), and N-nitroso-N-phenylhydroxylamine aluminum salt.

The amount of the heat polymerization inhibitor to be incorporated is preferably from about 0.01 to 5% by weight based on the total solid content in the image recording layer.

<Higher Aliphatic Acid Derivative>

The image recording layer material of the invention may comprise a high aliphatic acid derivative such as behenic acid and behenic acid amide or the like incorporated therein so that it is mal-distributed on the surface of the image recording layer during drying after spreading to prevent the inhibition of polymerization by oxygen. The amount of the higher aliphatic acid derivative to be incorporated is preferably from about 0.1 to 10% by weight based on the total solid content in the image recording layer.

<Plasticizer>

The image recording layer of the invention may comprise a plasticizer incorporated therein to enhance its on-the-machine developability.

Preferred examples of the plasticizer employable herein include phthalic acid esters such as dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate and diallyl phthalate, glycol esters such as dimethyl glycol, ethylphthalyl glycolate, methylphthalylethyl glycolate, butylphthalylbutyl glycolate and triethyleneglycol dicaprylic acid ester, phosphoric acid esters such as tricresyl phosphate and triphenyl phosphate, aliphatic dibasic acid esters such as diisobutyl adipate, dioctyl adipate, dimethyl sebacate, dibutyl sebacate, dioctyl azelate and dibutyl maleate, polyglycidyl methacrylate, trimethyl citrate, glycerintriacetyl ester and butyl laurate.

The content of the plasticizer is preferably about 30% by weight or less based on the total solid content in the image recording layer.

<Inorganic Particulate Material>

The image recording layer of the invention may comprise an inorganic particulate material incorporated therein to enhance the strength of hardened film on the image area and the on-the-machine developability of the non-image area.

Preferred examples of the inorganic particulate material employable herein include particulate silica, particulate aluminum, particulate magnesium oxide, particulate titanium oxide, particulate magnesium carbonate, particulate calcium alginate, and mixture thereof. These inorganic particulate materials may be used to reinforce the film and roughen the surface of the image recording layer and hence enhance the interfacial adhesivity even if they are not capable of converting light to heat.

The inorganic particulate material preferably has an average particle diameter of from 5 nm to 10 µm, more preferably from 0.5 µm to 3 µm. When the average particle diameter of the inorganic particulate material falls within the above defined range, the inorganic particulate material can be dispersed in the image recording layer in a stable manner to keep the strength of the image recording layer sufficiently high, making it possible to form a non-image area having an excellent hydrophilicity which is little subject to stain during printing.

The aforementioned inorganic particulate material can be easily available as a commercial product such as colloidal silica dispersion.

The content of the inorganic particulate material is preferably 40% o by weight or less, more preferably 30% by weight or less based on the total solid content in the image recording layer.

<Low Molecular Hydrophilic Compound>

The image recording layer of the invention may comprise a hydrophilic low molecular compound incorporated therein to enhance the on-the-machine developability thereof. Examples of the hydrophilic low molecular compound employable herein include water-soluble organic compounds such as glycol (e.g., ethylene glycol, diethylene glycol, triethylene glycol, propylene glycol, dipropylene glycol, tripropylene glycol) and ether or ester derivatives thereof, polyhydroxys (e.g., glycerin, pentaerythritol), organic amines (e.g., triethanolamine, diethanolamine, monoethanolamine) and salts thereof, organic sulfonic acids (e.g., toluenesulfonic acid, benzenesulfonic acid) and salts thereof, organic phosphonic acids (e.g., phenylphosphonic acid) and salts thereof, and organic carboxylic acids (e.g., tartaric acid, oxalic acid, citric acid, malic acid, lactic acid, gluconic acid, amino acid) and salts thereof <Formation of Image Recording Layer>

The image recording layer of the invention is formed by spreading a coating solution obtained by dispersing or dissolving the aforementioned necessary components in a solvent. Examples of the solvent employable herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyl lactone, toluene, and water. However, the invention is not limited to these solvents. These solvents may be used singly or in admixture. The solid concentration of the coating solution is preferably from 1 to 50% by weight.

The image recording layer of the invention may be formed also by preparing a coating solution having the same or different ones of the aforementioned components dispersed or dissolved in the same or different solvents in a plurality of portions, and then repeatedly spreading the coating solution over a support and drying the coat.

The spread of the image recording layer (solid content) on the support obtained after spreading and drying depends on the purpose but is preferably from 0.3 to 3.0 g/m$^2$. When the spread of the image recording layer falls within this range, the resulting lithographic printing plate precursor can be provided with a good sensitivity and good film properties of image recording layer.

The spreading of the image recording layer coating solution can be carried out by any of various methods. Examples of the spreading method employable herein include bar coating method, rotary coating method, spray coating method, curtain coating method, dip coating method, air knife coating method, blade coating method, and roll coating method.

<Backcoat Layer>

The support which has thus been subjected to surface treatment or has thus a undercoating layer formed thereon may then have a backcoat layer provided on the back side thereof as necessary.

Preferred examples of the backcoat layer employable herein include a layer made of an organic polymer compound as disclosed in JP-A-5-45885, and a layer made of a metal oxide obtained by the hydrolysis or polycondensation of an organic metal compound or inorganic metal compound as disclosed in JP-A-6-35174. In particular, silicon alkoxy compounds such as $Si(OCH_3)_4$, $Si(OC_2H_5)_4$, $Si(OC_3H_7)_4$ and $Si(OC_4H_9)_4$ are used to advantage because they are inexpensive and easily available.

<Protective Layer>

In the lithographic printing plate precursor of the invention, the image recording layer may have a protective layer provided thereon as necessary to prevent the occurrence of scratch, etc. on the image recording layer and ablation during high luminance laser exposure and block oxygen.

In the invention, exposure is normally conducted in the atmosphere. The protective layer acts to prevent low molecular compounds such as oxygen and basic material present in the atmosphere that inhibit the image forming reaction caused by exposure in the image recording layer from entering in the image recording layer and hence prevent the inhibition of the image forming reaction by exposure in the atmosphere. Accordingly, the protective layer is required to have a low permeability to low molecular compounds such as oxygen. More preferably, the protective layer has a good transmission of light used in exposure and an excellent adhesion to the image recording layer and can be easily removed at the on-the-machine development step after exposure. Various studies have long been made of protective layer having these properties. For the details of these studies, reference can be made to U.S. Pat. No. 3,458,311 and JP-B-55-49729.

As the material of the protective layer there may be used a water-soluble polymer compound having a relatively excellent crystallinity. Specific examples of the water-soluble polymer compound employable herein include water-soluble polymers such as polyvinyl alcohol, polyvinyl pyrrolidone, acidic cellulose, gelatin, gum Arabic and polyacrylic acid. In particular, the use of polyvinyl alcohol (PVA) as a main component makes it possible to give the best results with respect to basic properties such as oxygen barrier properties and development removability. The polyvinyl alcohol may be partly substituted by ester, ether or acetal and may partly have other copolymerizable components so far as it has unsubstituted vinyl alcohol units for rendering the protective layer with necessary oxygen barrier properties and water solubility.

Examples of the polyvinyl alcohol employable herein include those having a polymerization degree of from 300 to 2,400 which have been hydrolyzed in a proportion of from 71 to 100 mol %. Specific examples of these polyvinyl alcohols include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 produced by KURARAY Co., Ltd.

The constituents (e.g., selection of PVA, use of additives) of the protective layer, the spread of the protective layer coating solution, etc. are properly predetermined taking into account foggability, adhesion, scratch resistance, etc., besides oxygen barrier properties and development removability. In general, the higher the percent hydrolysis of PVA is(i.e., the higher the content of unsubstituted vinyl alcohol units in the protective layer is) or the greater the thickness of the protective layer is, the better are the oxygen barrier properties to advantage from the standpoint of sensitivity. In order to prevent the occurrence of unnecessary polymerization reaction during production or storage or unnecessary fogging and thickening of line image during imagewise exposure, the oxygen permeability is preferably not too high. Accordingly, the oxygen permeability A at 25° C. and 1 atm is preferably from not smaller than 0.2 to not greater than 20 (mL/m$^2$·day).

The protective layer of the invention may comprise an inorganic lamellar compound as disclosed in JP-A-11-38633 incorporated therein. The combination of an inorganic lamellar compound with the aforementioned binder makes it possible to obtain good oxygen barrier properties.

The inorganic lamellar compound to be used in the invention is a particulate material in the form of thin tablet. Examples of such an inorganic lamellar compound include a group of micas such as natural mica and synthetic mica represented by formula A (B, C)$_{2-5}$D$_4$O$_{10}$(OH, F, O)$_2$ (in which A represents any of K, Na and Ca; B and C each represent any of Fe(II), Fe(III), Mn, Al, Mg and V; and D represents Si or Al), talc represented by formula 3MgO.4SiO.H$_2$O, teniolite, montomorillonite, saponite, hectorite, and zirconium phosphate.

Examples of natural micas in the aforementioned group of micas include white mica, soda mica, gold mica, black mica, and flake mica. Examples of synthetic micas include nonexpandable micas such as fluorine-based gold mica KMg$_3$(AlSi$_3$O$_{10}$)F$_2$, potassium tetrasilicon mica KMg$_{2.5}$Si$_4$O$_{10}$)F$_2$, and expandable micas such as sodium tetrasilicic mica NaMg$_{2.5}$(Si$_4$O$_{10}$)F$_2$, sodium or lithium teniolite (Na, Li)Mg$_2$Li(Si$_4$O$_{10}$)F$_2$ and montmorillonite-based sodium or lithium hectorite (Na, Li)$_{1/8}$Mg$_{2/5}$Li$_{1/8}$(Si$_4$O$_{10}$)F$_2$. Further, synthetic smectite is also usable.

In the invention, particularly useful among the aforementioned inorganic lamellar compounds are fluorine-based expandable micas which are synthetic inorganic lamellar compounds.

Referring to the shape of the inorganic lamellar compound to be used in the invention, the thickness of the inorganic lamellar compound is preferably as small as possible from the standpoint of control over diffusion. The planar size of the inorganic lamellar compound is preferably as great as possible so far as the smoothness and transmittance of active rays of the coated surface cannot be impaired. Accordingly, the aspect ratio of the inorganic lamellar compound is 20 or more, preferably 100 or more, particularly 200 or more. The term "aspect ratio" as used herein is meant to indicate the ratio of thickness to major axis length of particle. For example, these dimensions can be measured on projected image of particle taken by microphotography. The greater the aspect ratio is, the greater is the resulting effect.

Referring to the particle diameter of the inorganic lamellar compound to be used in the invention, the average major axis length is from 0.3 µm to 20 µm, preferably from 0.5 µm to 10 µm, particularly from 1 µm to 5 µm. Further, the average thickness of the particle is 0.1 µm or less, preferably 0.05 µm or less, particularly 0.01 µm or less. For example, the expandable synthetic micas, which are representative compounds among the inorganic lamellar compounds, have a thickness of from 1 nm to 50 nm and a planar size of from about 1 to 20 µm.

When the particles of the inorganic lammelar compound having a high aspect ratio as mentioned above are incorporated into the protective layer, the film strength is improved and permeation of oxygen and water can be prevented effectively, whereby deterioration of the protective layer due to deformation and the like can be prevented.

The amount of the inorganic lamellar compound to be incorporated in the protective layer is from 5% to 55% by weight, preferably from 10% to 40% by weight based on the total solid content in the protective layer. When the amount of the inorganic lamellar compound falls below 5% by weight, no effect of enhancing adhesion can be exerted. On the contrary, when the amount of the inorganic lamellar compound exceeds 55% by weight, the resulting coat-forming properties are insufficient, causing the deterioration of sensitivity. Even when a plurality of inorganic lamellar compounds are used in combination, the total amount of these inorganic lamellar compounds preferably falls within the aforementioned range.

Glycerin, dipropylene glycol or the like may be incorporated as other constituents of the protective layer in an amount of few percents by weight based on the weight of the (co)polymer to render the protective layer flexible. Further, an anionic surface active agent such as sodium alkylsulfate and sodium alkylsulfonate, an amphoteric surface active agent such as alkylaminocarboxylate and alkylaminodicarboxylate and a nonionic surface active agent such as polyoxyethylene alkyl phenyl ether may be incorporated in the protective layer in an amount of few percents by weight based on the weight of the (co)copolymer.

The thickness of the protective layer is preferably from 0.05 µm to 4 µm, particularly from 0.1 µm to 2.5 µm.

The adhesion to the image area, scratch resistance, etc. are extremely important from the standpoint of handleability of lithographic printing plate precursor. In other words, when the protective layer, which comprises a water-soluble polymerizable compound and thus is hydrophilic, is laminated on the image recording layer, which is lipophilic, the lack of adhesion causes the protective layer to be easily peeled, occasionally resulting in the occurrence of defectives such as malhardening due to inhibition of polymerization by oxygen at the peeled area.

In order to improve the adhesion between the image recording layer and the protective layer, various proposals have been made. For example, JP-A-49-70702 and British Patent Application No. 1,303,578 disclose that the lamination of a hydrophilic polymer mainly composed of a polyvinyl alcohol mixed with from 20 to 60% by weight of an acrylic emulsion, a water-insoluble vinyl pyrrolidone-vinyl acetate copolymer, etc. on the image recording layer makes it possible to obtain sufficient adhesion. In the invention, all these known techniques may be employed. For the details of the method of spreading the protective layer coating solution, reference can be made to U.S. Pat. No. 3,458,311 and JP-B-55-49729.

Further, the protective layer may be provided with other functions. For example, the addition of a colorant (e.g., water-soluble dye) which fairly transmits infrared rays used in exposure but absorbs light having other wavelength ranges efficiently makes it possible to enhance safelight adaptability without causing sensitivity drop.

(Method of Producing Lithographic Printing Plate)

In the method of producing the lithographic printing plate of the invention, the aforementioned lithographic printing plate precursor of the invention is imagewise exposed to infrared laser beam.

The infrared laser to be used in the invention is not specifically limited. In practice, however, a solid laser or semiconductor laser which emits an infrared ray in a wavelength range of from 760 nm to 1,200 nm may be used. The output of the infrared laser is preferably 100 mW or more. In order to reduce the exposure time, a multi-beam laser device is preferably used.

The exposure time per pixel is preferably 20 μsec. or less. The radiation energy is preferably from 10 to 300 mJ/cm$^2$.

In the method of producing the lithographic printing plate of the invention, the lithographic printing plate precursor of the invention is imagewise exposed to infrared laser beam as mentioned above, and then supplied with an oil-based ink and an aqueous component for printing without passing through any development step.

Specific examples of the lithographic printing method employable herein include a method which comprises exposing the lithographic printing plate precursor to infrared laser beam, and then mounting the lithographic printing plate precursor on the printing machine for printing without passing through any development step, and a method which comprises mounting the lithographic printing plate precursor on the printing machine, exposing the lithographic printing plate precursor to infrared laser beam on the printing machine, and then effecting printing without passing any development step.

When the lithographic printing plate precursor which has been imagewise exposed to infrared laser beam is supplied with an aqueous component and an oil-based ink for printing without passing any development step, the image recording layer which has been hardened by exposure forms an oil-based ink-receiving area having a lipophilic surface on the exposed area thereof. On the other hand, on the unexposed area, the aqueous component and/or oil-based ink thus supplied causes the unhardened image recording layer to be dissolved or dispersed away so that a hydrophilic surface is exposed.

As a result, the aqueous component is attached to the hydrophilic surface thus exposed while the oil-based ink is attached to the image recording layer on the exposed area. Printing is then started. At this first stage, either the aqueous component or the oil-based ink may be supplied onto the surface of the printing plate. However, in order to prevent the aqueous component from being stained by the image recording layer on the unexposed area, it is preferred that the oil-based ink be supplied at the first stage. As the aqueous component and the oil-based ink there may be used dampening water and printing ink for ordinary lithographic printing, respectively.

Thus, the lithographic printing plate precursor of the invention is subjected to development on the offset printing machine, and then used as it is to print on a large number of sheets of paper.

EXAMPLES

The invention will be further described in the following examples, but the invention should not be construed as being limited thereto.

1. Preparation of Support

<Support 1>

An aluminum sheet (material: 1050) having a thickness of 0.3 mm was subjected to degreasing with a 10 wt-% aqueous solution of sodium aluminate at 50° C. for 30 seconds, grained on the surface thereof with an aqueous suspension of pumice having a median diameter of 25 μm (specific gravity: 1.1 g/cm$^3$) using three bundle-planted nylon brushes having a hair diameter of 0.3 mm, and then thoroughly washed with water to remove a rolling oil from the surface thereof. The aluminum sheet thus treated was dipped in a 25% aqueous solution of sodium hydroxide having a temperature of 45° C. for 9 seconds to undergo etching, washed with water, dipped in a 20% nitric acid having a temperature of 60° C. for 20 seconds, and then washed with water. The etched amount of the grained surface of the aluminum sheet was about 3 g/m$^2$.

Subsequently, the aluminum sheet was continuously subjected to electrochemical roughening with 60 Hz ac voltage. The electrolyte used in the electrochemical roughening was a 1 wt-% aqueous solution of nitric acid (containing 0.5% by weight of aluminum ion). The temperature of the electrolyte was 50° C. The waveform of the ac voltage was trapezoid wherein the time TP required until the current reaches from zero to peak is 0.8 msec and the duty ratio is 1:1. With this rectangular ac voltage, the electrochemical roughening was effected using a carbon electrode as a counter electrode. As an auxiliary anode there was used ferrite. The current density was 30 A/dm$^2$ when the current was at peak. 5% of the current from the electric supply was branched to the auxiliary anode. The amount of electricity used in electrolysis with nitric acid was 175 C/dm$^2$, which was consumed during the anodization of the aluminum sheet.

Subsequently, the aluminum sheet was subjected to electrochemical roughening with a 0.5 wt-% aqueous solution of hydrochloric acid (containing 0.5% by weight of aluminum ion) having a temperature of 50° C. in the same manner as in electrolysis with nitric acid under the conditions such that the amount of electricity consumed during anodization of aluminum sheet is 50 C/dm$^2$, and then spray-washed with water. The aluminum sheet thus treated was subjected to dc anodization with a 15 wt-% sulfuric acid (containing 0.5% by weight of aluminum ion) as an electrolyte at a current density of 15 A/dm$^2$ to form an anodized layer in an amount of 2.5 g/m$^2$, washed with water, dried. The support thus prepared was then measured for central line-average roughness (Ra) using a needle having a diameter of 2 μm. The result was 0.51 μm.

<Support 2> FZP-Treated Substrate

A support which had an anodized layer provided thereon in the same manner as the aforementioned support 1 was dipped in a solution with pH3.7 containing 0.1% by weight of sodium fluorozirconate and 1% by weight of sodium dihydrogenphosphate which had been heated to 75° C. for 10 seconds to seal micropores.

<Support 3>: Steam-Sealed Substrate

A support which had an anodized layer provided thereon in the same manner as the aforementioned support 1 was exposed to a 100° C. saturated steam atmosphere for 10 seconds to seal micropores.

<Support 4>

The aforementioned support 1 was treated with a 2.5 wt-% aqueous solution of sodium silicate at 30° C. for 10 seconds.

The following undercoating solution (1) was then spread over each of the aforementioned supports in such an amount that the dried spread was 6 mg/m² to provide a undercoating layer containing a water-soluble polymer. Thus, supports to be used in the following experiments were prepared.

| Undercoating solution (1) | |
|---|---|
| Undercoating compound (set forth in Table 1) | 0.017 g |
| Methanol | 9.00 g |
| Water | 1.001 g |

2. Preparation of Lithographic Printing Plate Precursor

Examples 1 to 11

The image recording layer coating solution (1) having the following formulation was bar-spread over each of the aforementioned supports, and then oven-dried at 100° C. for 60 seconds to form an image recording layer having a dried spread of 1.0 g/m². Which of the supports 1 to 4 is used in the respective example is set forth in Table 1.

The image recording layer coating solution (1) was obtained by mixing the following photosensitive solution (1) and microcapsule solution (1) with stirring shortly before spreading.

| Photosensitive solution (1) | |
|---|---|
| Binder polymer (1) | 0.162 g |
| Polymerization initiator (1) | 0.100 g |
| Infrared absorbent (1) | 0.020 g |
| Polymerizable compound | 0.385 g |
| (Aronix M-215, produced by TOAGOSEI CO., LTD.) | |
| Fluorine-based surface active agent (1) | 0.044 g |
| Methyl ethyl ketone | 1.091 g |
| 2-Methoxy-1-propanol | 8.609 g |
| Microcapsule solution (1) | |
| Microcapsule solution (1) synthesized below | 2.640 g |
| Water | 2.425 g |

Binder polymer (1)

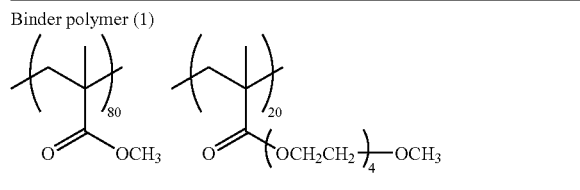

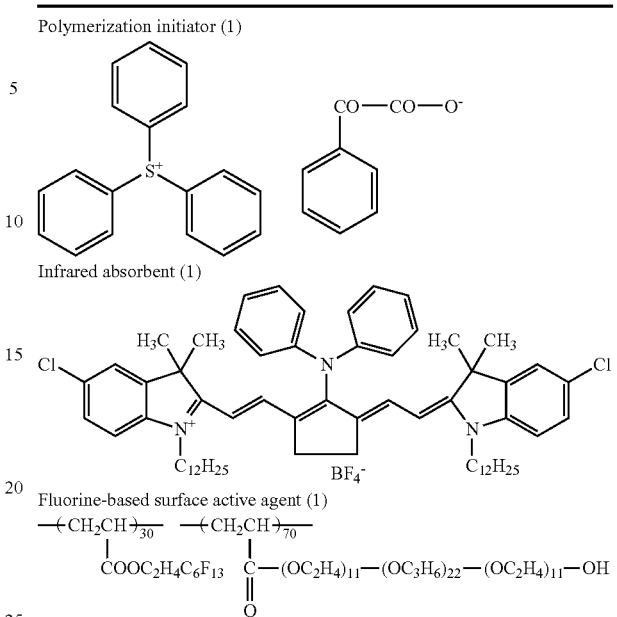

Synthesis of Microcapsule (1)

In order to prepare an oil phase component, 10 g of an adduct of trimethylolpropane and xylylene diisocyanate (Takenate D-110N, produced by MITSUI TAKEDA CHEMICALS, INC.), 3.15 g of pentaerythritol triacrylate (SR444, produced by NIPPON KAYAKU CO., LTD.), 0.35 g of the following infrared absorbent (2), 1 g of 3-(N,N-diethylamino)-6-methyl-7-anilinofluorane (ODB, produced by Yamamoto Chemicals Inc.) and 0.1 g of Pionin A-41C (Produced by Takemoto oil & Fat.) were dissolved in 17 g of ethyl acetate. As an aqueous phase component, 40 g of a 4 wt-% aqueous solution of pdyvinyl alcohol (PVA-205, produced by KURARAY CO.,) was prepared. The oil phase component and the aqueous phase component were mixed, and then subjected to emulsification at 12,000 rpm using a homogenizer for 10 minutes. The emulsified material thus obtained was added to 25 g. of distilled water, stirred at room temperature for 30 minutes, and then stirred at 40° C. for 3 hours. The microcapsule solution thus obtained was diluted with distilled water in such an amount that the solid concentration thereof reached 15% by weight. All these samples exhibited an average particle diameter of 0.2 μm.

The protective layer coating solution (1) having the following formulation was bar-spread over the image recording layer, and then oven-dried at 125° C. for 75 seconds to form a protective layer having a dried spread of 0.15 g/m². Thus, a lithographic printing plate precursor was obtained.

| Protective layer coating solution (1) | |
|---|---|
| Polyvinyl alcohol (PVA105, produced by KURARAY CO., LTD.; saponification degree: 98.5 mol-%; polymerization degree: 500; 6 wt-% aqueous solution) | 2.24 g |
| Vinyl acetate/vinyl pyrrolidone copolymer (Luviskol VA64W, produced by BASF; 50 wt-% aqueous solution) | 0.0073 g |
| Polyvinyl pyrrolidone (K30) | 0.0053 g |

| Protective layer coating solution (1) | |
|---|---|
| Surface active agent (Emalex 710, produced by KAO CORPORATION; 1 wt-% aqueous solution) | 2.15 g |
| Flake synthetic mica (MEB3L, produced by UNICOO; average particle diameter: 1 to 5 µmφ; 3.4 wt-% aqueous dispersion) | 3.75 g |
| Distilled water | 10.60 g |

Example 12

The image recording layer coating solution (2) having the following formulation was bar-spread over the support set forth in Table 1, oven-dried at 100° C. for 60 seconds to form an image recording layer having a dried spread of 1.3 g/m², and then provided with a protective layer in the same manner as in Example 1 to obtain a lithographic printing plate precursor.

The image recording layer coating solution (2) was obtained by mixing the following photosensitive solution (2) and the aforementioned microcapsule solution (1) with stirring shortly before spreading.

| Photosensitive solution (2) | |
|---|---|
| Binder polymer (1) | 0.162 g |
| Polymerization initiator (2) | 0.160 g |
| Polymerization initiator (3) | 0.180 g |
| Infrared absorbent (2) | 0.038 g |
| Polymerizable compound (Aronix M-215, produced by TOAGOSEI CO., LTD.) | 0.385 g |
| Fluorine-based surface active agent (1) | 0.044 g |
| Methyl ethyl ketone | 1.091 g |
| 2-Methoxy-1-propanol | 8.609 g |

Polymerization initiator (2)

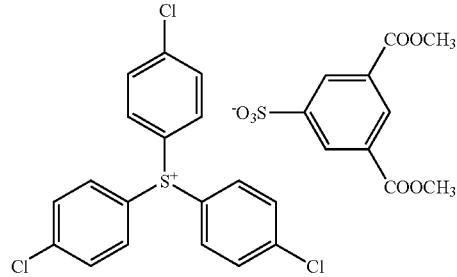

Polymerization initiator (3)

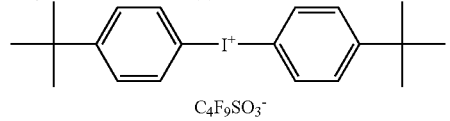

Infrared absorbent (2)

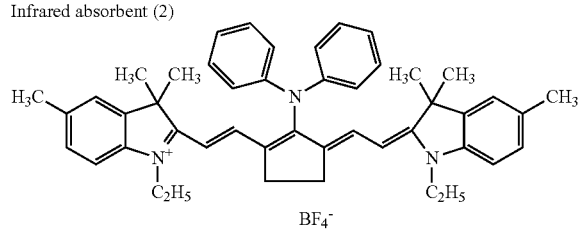

Comparative Examples 1 to 3

Lithographic printing plate precursors of Comparative Examples 1 to 3 were prepared in the same manner as in Example 1 except that the undercoating solution (1) was changed as follows.

In Comparative Example 1, an undercoating solution having the same formulation as the undercoating solution (1) but free of undercoating compound was used. In Comparative Example 2, as the undercoating compound there was used PVA105 (polyvinyl alcohol having a saponification degree of 98.5 mol-% produced by KURARAY CO., LTD.). In Comparative Example 3, as the undercoating compound there was used PVPA (polyvinylphosphonic acid produced by PCAS Chemicals Inc.).

Comparative Example 4

A lithographic printing plate precursor was prepared in the same manner as in Example 1 except that the following undercoating solution (2) was used instead of the undercoating solution (1). The undercoating solution (2) was spread in an amount of 6 mg/m² as calculated in terms of P-AMPS (poly(sodium 2-acrylamide-2-methylpropanesulfonate)).

| Undercoating solution (2) | |
|---|---|
| P-AMPS (poly(sodium 2-acrylamide-2-methylpropanesulfonate); produced by Aldrich Inc.; 15 wt-% aqueous solution) | 0.067 g |
| Methanol | 8.94 g |
| Water | 1.00 g |

Comparative Example 5

A lithographic printing plate precursor was prepared in the same manner as in Example 1 except that the support 1 was replaced by the support 2 and the compound D was used as an undercoating compound.

3. Evaluation of Lithographic Printing Plate Precursor

The lithographic printing plate precursors thus obtained were each then evaluated in the following manner.

Using Trendsetter 3244VX (produced by CREO CO., LTD.) equipped with a water-cooled 40 W infrared semiconductor laser, the lithographic printing plate precursor was exposed to light at an output of 9 W, an external drum rotary speed of 210 rpm and a resolution of 2,400 dpi. The image to which the lithographic printing plate precursor is exposed comprised a fine line chart.

(A) Evaluation of on-the-Machine Developability and Press Life

The lithographic printing plate precursor thus exposed was then mounted undeveloped on the cylinder of a Type SOR-M printing machine (produced by Heidelberg Inc.). A dampening water (4/96 (by volume) mixture of IF102 (etching solution produced by Fuji Photo Film Co., Ltd.) and water) and a Type TRANS-G(N) black ink (produced by DAINIPPON INK AND CHEMICALS, INCORPORATED) were supplied onto the lithographic printing plate precursor. Thereafter, printing was effected on 100 sheets of paper at a printing speed of 6,000 sheets per hour. The number of sheets of printing paper required until the unexposed area on the image recording layer on the printing machine is completed and the ink is no longer transferred to the printing paper was then measured.

As the printing proceeds more, the image recording layer was gradually abraded to deteriorate the ink-receptivity thereof, causing the drop of ink density on the printing paper. The press life was evaluated by measuring the number of sheet of printing paper required until the ink density (reflection density) shows a drop of 0.1 from that at the beginning of printing. The results are set forth in Table 1.

(B) Evaluation of Age Stability

The coated sample was allowed to stand in a constant temperature and humidity tank which had been kept at 45° C. and 75% RH for 3 days, exposed to light under the aforementioned conditions, and then mounted on the cylinder of a Type SOR-M printing machine (produced by Heidelberg Inc.). A dampening water (4/96 (by volume) mixture of IF102 (etching solution produced by Fuji Photo Film Co., Ltd.) and water) and a Type TRANS-G(N) black ink (produced by DAINIPPON INK AND CHEMICALS, INCORPORATED) were supplied onto the lithographic printing plate precursor. The lithographic printing plate precursor was then measured for on-the-machine developability in the same manner as mentioned above.

(C) Evaluation of Stainproofness

The same exposed lithographic printing plate precursor as used above was mounted undeveloped on the cylinder of a Type SOR-M printing machine (produced by Heidelberg Inc.). A dampening water (4/96 (by volume) mixture of IF102 (etching solution produced by Fuji Photo Film Co., Ltd.) and water) and a 90/10 (by weight) mixture of a Type TRANS-G (N) red ink (produced by DAINIPPON INK AND CHEMICALS, INCORPORATED) and varnish were supplied onto the lithographic printing plate precursor. Printing was then effected on 500 sheets of paper at a printing speed of 6,000 sheets per hour. After the completion of development on the printing machine, the lithographic printing plate precursor was then squeezed to remove the dampening water. The surface of the lithographic printing plate was then stained with the ink. The dampening water was then again supplied onto the surface of the lithographic printing plate. Under these conditions, the number of sheets of paper required until the ink is completely removed from the non-image area to obtain a good printed matter was then measured. The less this number of sheets of paper is, the better are the hydrophilicity and water retention of the non-image area on the printing plate. The results are set forth in Table 1.

(D) Measurement of Residue of Sulfonic Acid after Printing (PyGC-MS)

The same exposed lithographic printing plate precursor as used above was mounted undeveloped on the cylinder of a Type SOR-M printing machine (produced by Heidelberg Inc.). A dampening water (4/96 (by volume) mixture of IF102 (etching solution produced by Fuji Photo Film Co., Ltd.) and water) and a 90/10 (by weight) mixture of a Type TRANS-G (N) red ink (produced by DAINIPPON INK AND CHEMICALS, INCORPORATED) and varnish were supplied onto the lithographic printing plate precursor. Printing was then effected on 2,000 sheets of paper at a printing speed of 6,000 sheets per hour. After the completion of development on the printing machine, the lithographic printing plate precursor was then squeezed to remove the ink. Printing was then effected with excessive dampening water on the surface of the printing plate to completely remove the ink. The printing plate was detached from the cylinder of the printing machine. The non-image area was sampled in a size of 12 mm×90 mm. The sample was divided into 6 portions which were then measured for presence or absence of m/e=63.96 ($SO_2$ fragment) using PyGC-MS (pyrolysis gas chromatography/mass spectrometer) under the following conditions.

G: Detected
P: Not detected

PyGC-MS Analysis Conditions:

<Py conditions> Double shot pyrolyzer produced by Frontier Lab Ltd.

Pyrolysis conditions: 500° C., 0.1 min

<GC conditions> HP-6890, produced by Agilent Inc.

Column: DB-5 60 m×0.25 mmId (thickness: 1 μm)

Analysis temperature: 50° C. (retained for 2 min.)→heated 8° C./min→250° C. (retained for 18 min.)

Carrier gas: He=1 ml/min

Temperature of injection port: 260° C.

Split ratio: 10/1

<MS conditions> Type JMS-GCmate magnetic field type mass spectrometer, produced by JEOL Ltd.

Ionizing method: Electron impact (EI), 70 eV, 300 μA

Ion source temperature: 250° C.

Interface temperature: 260° C.

TABLE 1

| | No. | | | | | | | | | | | |
|---|---|---|---|---|---|---|---|---|---|---|---|---|
| | Example | | | | | | | | | | | |
| | 1 | 2 | 3 | 4 | 5 | 6 | 7 | 8 | 9 | 10 | 11 | 12 |
| Support | 1 | 1 | 1 | 1 | 1 | 1 | 1 | 1 | 2 | 3 | 4 | 1 |
| Undercoating compound | A | B | C | D | E | F | G | H | H | H | H | H |
| Image recording layer | PL1* | | | | | | PL1 | | | | | PL2 |
| Protective layer | | | | | Protective layer coating solution 1 | | | | | | | |
| On-the-machine developability (sheets) | 25 | 25 | 20 | 18 | 25 | 25 | 25 | 25 | 25 | 30 | 20 | 25 |
| Press life (×10$^4$ sheets) | 4 | 4 | 3.5 | 3 | 4.5 | 4 | 6 | 6 | 6 | 8 | 6 | 5 |
| Stainproofness (sheets) | 25 | 25 | 20 | 20 | 30 | 25 | 30 | 30 | 20 | 20 | 18 | 30 |
| Age stability (sheets) | 40 | 35 | 30 | 25 | 40 | 35 | 40 | 30 | 25 | 35 | 20 | 30 |
| Residue of sulfonic acid after printing | G | G | G | G | G | G | G | G | G | G | G | G |

TABLE 1-continued

|  | No. |  |  |  |  |
|---|---|---|---|---|---|
|  | Comparative Example | | | | |
|  | 1 | 2 | 3 | 4 | 5 |
| Support | 1 | 1 | 1 | 1 | 2 |
| Undercoating compound | None | PVA105 | PVPA | P-AMPS | D |
| Image recording layer | | | PL1 | | |
| Protective layer | | Protective layer coating solution 1 | | | |
| On-the-machine developability (sheets) | 30 | 100 | 30 | 25 | 20 |
| Press life ($\times 10^4$ sheets) | 0 | 5 | 0.5 | 0 | 0 |
| Stainproofness (sheets) | 35 | 70 | 40 | 35 | 35 |
| Age stability (sheets) | >100 | >100 | 60 | 40 | 40 |
| Residue of sulfonic acid after printing | P | P | P | P | P |

Note:
PL1* indicates photosensitive layer 1.

Compound A

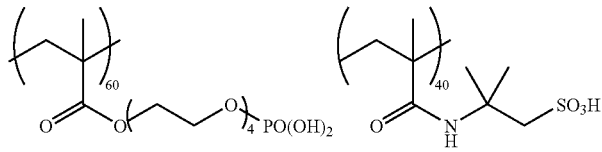

Compound B

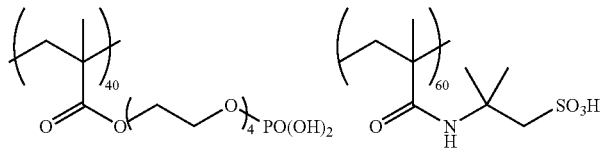

Compound C

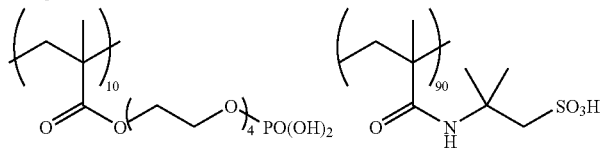

Compound D

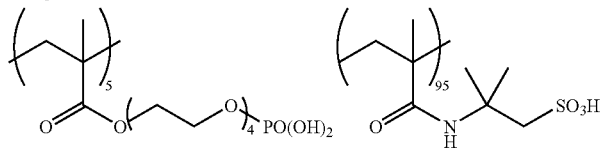

Compound E

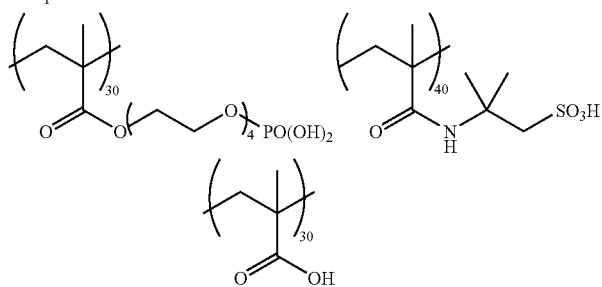

TABLE 1-continued
Compound F
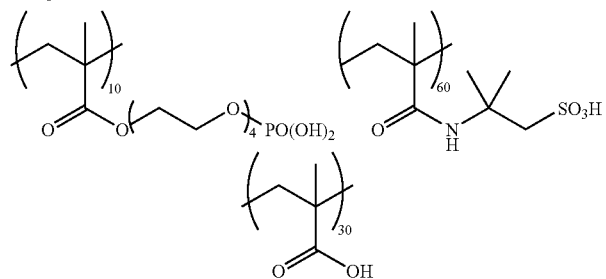
Compound G
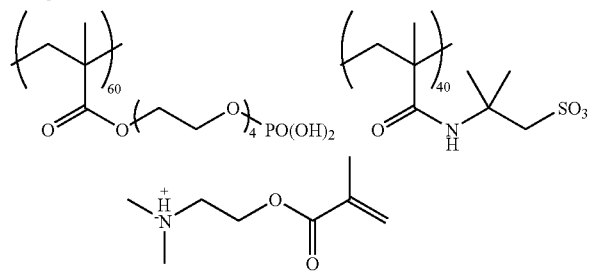
Compound H
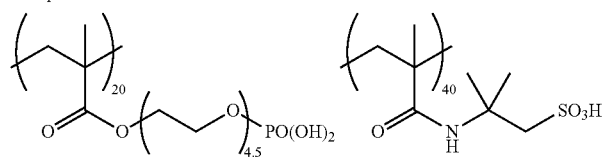
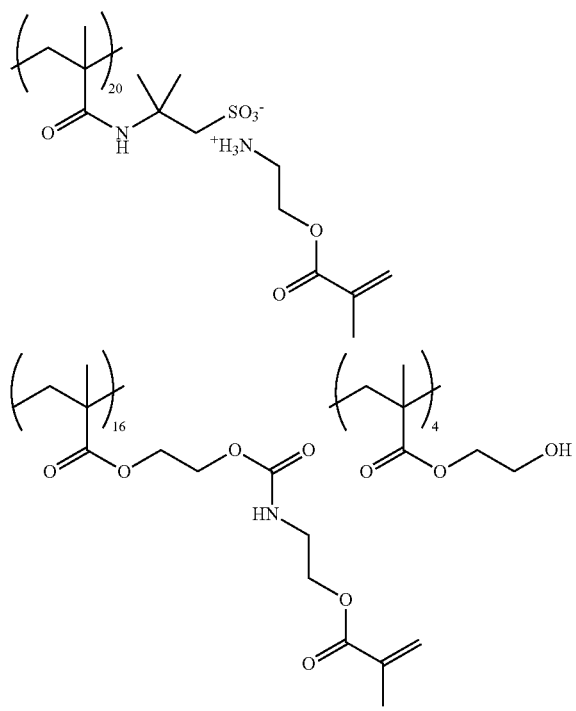

As can be seen in the results of Table 1, the inventive method of producing a lithographic printing plate precursor from the lithographic printing plate precursor of the invention can provide a lithographic printing plate precursor excellent in on-the-machine developability, press life and stainproofness as compared with the methods involving the use of related art lithographic printing plate precursor (Comparative Examples 1 to 5).

Example 13

A lithographic printing plate precursor was prepared in the same manner as in Example 1 except that the microcapsule solution (1) was replaced by the following microgel solution (1). The lithographic printing plate precursor thus prepared was then evaluated.

The lithographic printing plate precursor thus prepared showed an on-the-machine developability of 23 sheets, a press life of 50,000 sheets, a stainproofness of 25 sheets and an age stability of 30 sheets. When measured for residue of sulfonic acid after printing, the lithographic printing plate precursor was considered to show "Detected".

| Microgel solution (1) | |
|---|---|
| Microgel (1) synthesized below | 2.640 g |
| Distilled water | 2.425 g |

(Synthesis of Microgel (1))

10 g of a trimethylolpropane-xylene diisocyanate adduct (Takenate D-110N, produced by MITSUI TAKEDA CHEMICALS, INC.), 3.15 g of a pentaerythritol triacrylate (SR444, produced by Nippon Kayaku Corporation) and 0.1 g of Pionin A-41C (produced by Takemoto oil&fat) were dissolved in 17 g of ethyl acetate as oil phase components. As an aqueous phase component, 40 g of a 4 wt-% aqueous solution of PVA-205 was prepared. The oil phase components and the aqueous component were mixed, and then subjected to emulsification at 12,000 rpm using homogenizer. The emulsion thus obtained was added to 25 g of distilled water, stirred at room temperature for 30 minutes; and then stirred at 50° C. for 3 hours. The microgel solution thus obtained was then diluted with distilled water such that the solid content concentration reached 15% by weight. The average particle diameter of the microgel was 0.2 µm.

While the invention has been described in detail and with reference to specific embodiments thereof, it will be apparent to one skilled in the art that various changes and modifications can be made therein without departing from the spirit and scope thereof.

The present application claims foreign priority based on Japanese Patent Application Nos. JP2004-358727 and JP2005-212925, filed on Dec. 10, 2004 and Jul. 22, 2005, respectively, the contents of which is incorporated herein by reference.

What is claimed is:

1. A lithographic printing plate precursor comprising:
    a porous aluminum support;
    a layer containing a water-soluble polymer resin having a hydrophilic group and a sulfonic acid group, the hydrophilic group being adsorbable to a surface of the porous aluminum support; and
    an image recording layer, wherein after the image recording layer is exposed to light, an unexposed area can be removed from the image recording layer on a printing machine by supplying an oil-based ink and an aqueous component to the image recording layer without being subjected to development,
    wherein the layer containing the water-soluble polymer resin has the sulfonic acid group left therein after coming in contact with the oil-based ink and the aqueous component, and wherein the water-soluble resin has a content of a unit having the sulfonic group of from 30 to 98 mol-%,
    wherein the image recording layer is disposed directly on the layer containing a water-soluble polymer resin, and
    wherein the water-soluble polymer resin comprises a crosslinkable group.

2. The lithographic printing plate precursor according to claim 1, wherein the water-soluble polymer resin has at least one selected from the group consisting of onium salt group, phosphoric acid ester group, phosphonic acid group, boric acid group, β-diketone group, carboxylic acid group, carboester group, hydroxyl group and carbamoyl group as the hydrophilic group.

3. The lithographic printing plate precursor according to claim 1, wherein the water-soluble resin has a content of a unit having the hydrophilic group being adsorbable to the surface of the porous aluminum support of from 2 to 80 mol-%.

4. The lithographic printing plate precursor according to claim 1, wherein the image recording layer comprises at least one of a microcapsule and microgel.

5. A method of producing a lithographic printing plate, which comprises:
    exposing a lithographic printing plate precursor according to claim 1 to light; and
    supplying an oil-based ink and an aqueous component to the lithographic printing plate precursor on the printing machine without being subjected to development so as to remove an unexposed area from the image recording layer.

6. The lithographic printing plate precursor according to claim 1, wherein the crosslinkable group is incorporated in the water-soluble polymer resin by forming a salt structure with a compound having a substituent having a charge counter to that of a polar substituent in the water-soluble polymer resin and an ethylenically unsaturated bond.

7. The lithographic printing plate precursor according to claim 2, wherein the crosslinkable group is incorporated into the water-soluble polymer resin by forming a salt structure with a compound having a substituent having a charge counter to that of a polar substituent in the water-soluble polymer resin and an ethylenically unsaturated bond.

8. The lithographic printing plate precursor according to claim 1, wherein the crosslinkable group is an ethylenically unsaturated bond, and is incorporated in side chains of the water-soluble polymer resin.

9. The lithographic printing plate precursor according to claim 2, wherein the crosslinkable group is an ethylenically unsaturated bond, and is incorporated in side chains of the water-soluble polymer resin.

10. The lithographic printing plate precursor according to claim 1, wherein the water-soluble resin comprises a monomer unit represented by the following structure:

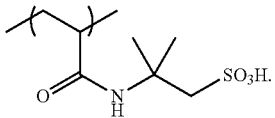

11. The lithographic printing plate precursor according to claim 2, wherein the water-soluble resin comprises a monomer unit represented by the following structure:

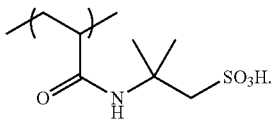

12. The lithographic printing plate precursor according to claim 7, wherein the water-soluble resin comprises a monomer unit represented by the following structure:

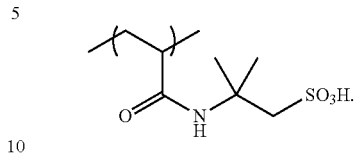

13. The lithographic printing plate precursor according to claim 9, wherein the water-soluble resin comprises a monomer unit represented by the following structure:

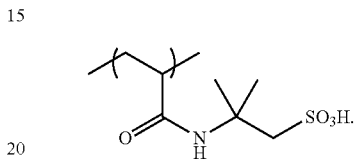

* * * * *